(12) United States Patent
Matsumoto et al.

(10) Patent No.: US 6,740,466 B1
(45) Date of Patent: May 25, 2004

(54) PHOTOPOLYMERIZABLE COMPOSITION AND RECORDING MATERIAL USING THE SAME

(75) Inventors: Hirotaka Matsumoto, Shizuoka-ken (JP); Masanobu Takashima, Shizuoka-ken (JP); Shintaro Washizu, Shizuoka-ken (JP); Koichi Kawamura, Shizuoka-ken (JP); Tadahiro Sorori, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/676,487

(22) Filed: Oct. 2, 2000

(30) Foreign Application Priority Data

Nov. 15, 1999 (JP) .............................................. 11-323762
Mar. 30, 2000 (JP) ........................................ 2000-094431

(51) Int. Cl.$^7$ .............................................. G03F 7/004
(52) U.S. Cl. ................. 430/270.1; 430/138; 430/281.1; 430/293; 568/1; 522/16
(58) Field of Search ........................... 430/270.1, 281.1, 430/293, 138, 374, 503, 517, 913, 916, 920; 568/1; 522/16

(56) References Cited

U.S. PATENT DOCUMENTS

| | | | | |
|---|---|---|---|---|
| 4,282,309 | A | | 8/1981 | Laridon et al. .............. 430/281 |
| 4,636,459 | A | * | 1/1987 | Kawamura et al. .......... 430/288 |
| 4,772,541 | A | | 9/1988 | Gottschalk et al. .......... 430/339 |
| 5,055,372 | A | * | 10/1991 | Shanklin et al. ............. 430/138 |
| 5,061,605 | A | * | 10/1991 | Kawamura et al. .......... 430/281 |
| 5,618,856 | A | * | 4/1997 | Yoshinaga et al. ............. 522/16 |
| 5,858,617 | A | * | 1/1999 | Nakayama et al. ....... 430/281.1 |
| 5,965,324 | A | * | 10/1999 | Okubo et al. ............. 430/281.1 |
| 6,011,180 | A | * | 1/2000 | Cunningham et al. .......... 568/8 |
| 6,022,664 | A | * | 2/2000 | Washizu et al. ............. 430/138 |
| 6,107,066 | A | * | 8/2000 | Tsien et al. .............. 435/173.4 |
| 6,468,711 | B1 | * | 10/2002 | Sorori et al. ............. 430/270.1 |

FOREIGN PATENT DOCUMENTS

| | | | |
|---|---|---|---|
| DE | 38 22 921 A1 | 1/1989 | ............. G03F/7/10 |
| DE | 196 48 282 A1 | 5/1997 | ............. C07F/5/02 |
| EP | 591786 A2 * | 9/1993 | ........... G03F/7/031 |
| EP | 81276 A1 * | 1/1998 | ........... G03F/7/031 |
| JP | 63-59130 | 11/1988 | ............. G03C/1/68 |
| JP | 08211552 A * | 8/1996 | ............. G03C/1/83 |
| JP | 9-236913 | 9/1997 | ............. G03F/7/004 |
| JP | 2701453 | 10/1997 | ............. C08F/2/50 |
| JP | 2729236 | 12/1997 | ............... C09J/4/00 |
| JP | 10-39499 | 2/1998 | ........... G03F/7/004 |

OTHER PUBLICATIONS

Machine translation of JP 08–211552 to Sakurada et al.*
Patent Abstract of Japan, 09–236913, Sep. 9, 1997.
Abstract, DE 3822921 A, Jan. 19, 1989.
Abstract, GB 2307473 A, May 28, 1997.

* cited by examiner

Primary Examiner—Mark F. Huff
Assistant Examiner—Yvette C. Thornton
(74) Attorney, Agent, or Firm—Sughrue Mion, PLLC

(57) ABSTRACT

Provided is a photopolymerizable composition which has a high sensitivity to not only ultraviolet light but also to visible to infrared light. The photopolymerizable composition is a composition comprising a polymerizable compound having an ethylenically unsaturated bond, a compound represented by the following general formula (1), and an organoboron compound represented by the following general formula (A):

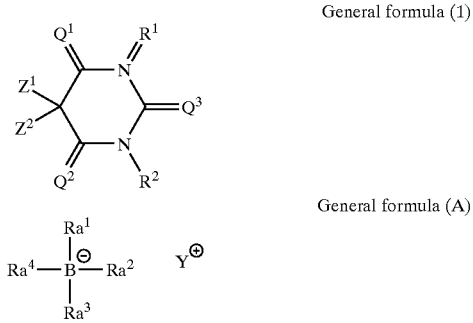

General formula (1)

General formula (A)

7 Claims, No Drawings

US 6,740,466 B1

PHOTOPOLYMERIZABLE COMPOSITION AND RECORDING MATERIAL USING THE SAME

BACKGROUND OF THE INVENTION

1. Field of the Invention

The present invention relates to a photopolymerizable composition with which recording can be easily carried out not only using ultraviolet light but also using visible to infrared light and can be suitably applied to a wide range of fields including ink, color filter, hologram, proof, sealant, adhesive, planographic printing, resin relief plate, and photoresist, and to a recording material which does not require the use of a developing solution and the like and does not produce unnecessary wastes and can easily form black and white or colored perfectly dry images having excellent clarity and high contrast.

2. Description of the Related Art

Basically, a photopolymerizable composition contains a photopolymerization initiator and an addition-polymerizable compound having two or more ethylenically unsaturated bonds in the molecule (i.e., a polyfunctional monomer) and, when irradiated with light, the photopolymerizable composition hardens, changes its adhesiveness, or becomes insoluble in solvent. Utilizing these properties, a photopolymerizable composition has been widely used in such applications as photography, printing, metal surface processing, and ink.

Recently, the image formation utilizing a photopolymerizable composition has been extensively studied. For example, an image-forming system, which utilizes photosensitive microcapsules enclosing a photopolymerizable composition, has been proposed. In addition, in recent years, there has been an attempt to form digital images by spectrally sensitizing a photopolymerizable composition to a visible light region and using a laser as a light source (e.g., Journal of the Photographic Society of Japan, Vol. 49(1986), No.5, pp.210). Research to apply a photopolymerizable composition to a full-color photosensitive material (e.g., Japanese Patent Application Laid-Open (JP-A) No. 59-189340) has also been carried out. Further, a novel photopolymerizable composition using an organoboron anion salt of an organic cationic dye (e.g., European Patent No. 223,587A1) has been proposed. These photo- and heat-sensitive recording materials utilizing photopolymerizable compositions enable a perfectly dry image-recording system without using a developing solution and the like, and therefore these recording materials are environmentally very advantageous because wastes are not produced.

When images are recorded in a photosensitive recording material, it is advantageous if an inexpensive infrared laser and green to red light can be utilized in addition to UV light and short-wave visible light. However, many of recording materials utilizing photopolymerizable compositions are sensitive to ultraviolet light but are not sensitive to visible to infrared light or, even if sensitive to such light, the sensitivity is insufficient. As a result, since these recording materials are not free from the problems that the images formed are unclear and the contrast between image portions and non-image portions is insufficient, a need exists for further improvement.

SUMMARY OF THE INVENTION

The task of the present invention is to solve the problems of the prior art and to achieve the following objects. That is, an object of the present invention is to provide a photopolymerizable composition which has a high sensitivity to not only ultraviolet light but also to visible to infrared light and can be suitably applied to a wide range of fields including ink, color filter, hologram, proof, sealant, adhesive, planographic printing, resin relief plate, and photoresist. Another object of the present invention is to provide a recording material which enables a perfectly dry image-recording system and which can easily form black and white or colored images having excellent clarity and high contrast by the use of the above-mentioned photosensitive composition. In particular, an object of the present invention is to provide a recording material in which the fogging of the background is reduced.

In order to solve the problems described above, the photosensitive composition according to the first object of the present invention comprises a polymerizable compound having an ethylenically unsaturated bond, a compound represented by the following general formula (1), and an organoboron compound represented by the following general formula (A):

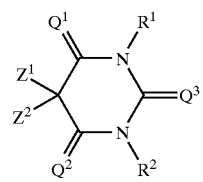

General formula (1)

In the general formula (1) $Q^1$ to $Q^3$ each independently represents an oxygen atom or a sulfur atom; $R^1$ and $R^2$ each independently represents a hydrogen atom, an aliphatic group, an aromatic group, or a heterocyclic group; and $Z^1$ and $Z^2$ each independently represents a substituent necessary for the compound represented by the general formula (1) to become a dye;

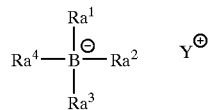

General formula (A)

In the general formula (A), $Ra^1$, $Ra^2$, and $Ra^3$ each independently represents an aliphatic group, an aromatic group, a heterocyclic group, or $-SiRa^5Ra^6Ra^7$ where $Ra^5$, $Ra^6$, and $Ra^7$ each independently represents an aliphatic group or an aromatic group; $Ra^4$ represents an aliphatic group; and $Y^+$ represents a group capable of forming a cation.

In the photopolymerizable composition according to the first object, the compound represented by the general formula (1) is preferably a compound represented by the following general formula (4):

General formula (4)

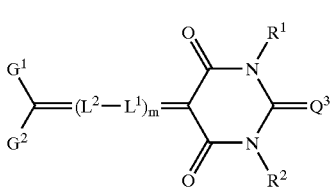

In the general formula (4), $L^1$ and $L^2$ each independently represents a methine group which may be substituted; m represent an integer of 0 to 3; and $G^1$ and $G^2$ each independently represents an electron-withdrawing group, or $G^1$ and $G^2$ join together to form an aromatic ring or a heterocycle.

In order to solve the problems described above, the photosensitive composition according to the second object of the present invention comprises a polymerizable compound having an ethylenically unsaturated bond, a compound represented by the following general formula (2), and a compound capable of interacting with the compound represented by the following general formula (2) to generate a radical:

General formula (2)

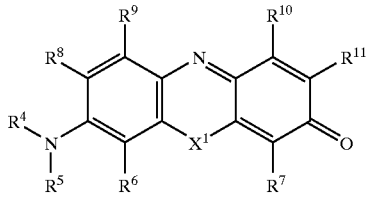

In the general formula (2), $X^1$ represents $NR^{12}$, a sulfur atom, a selenium atom, or an oxygen atom; $R^4$, $R^5$, and $R^{12}$ each independently represents a hydrogen atom, an aliphatic group, an aromatic group, or a heterocyclic group; and $R^6$, $R^7$, $R^8$, $R^9$, $R^{10}$, and $R^{11}$ each independently represents a hydrogen atom or a monovalent substituent, with the proviso that two or more selected from $R^6$, $R^7$, $R^8$, $R^9$, $R^{10}$, $R^{11}$, and $R^{12}$ may join together to form a ring.

In order to solve the problems described above, the photosensitive composition according to the third object of the present invention comprises a polymerizable compound having an ethylenically unsaturated bond, a compound represented by the following general formula (3), and a compound capable of interacting with the compound represented by the following general formula (3) to generate a radical:

General formula (3)

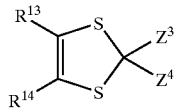

In the general formula (3), $R^{13}$ and $R^{14}$ each independently represents a hydrogen atom or a monovalent substituent; and $Z^3$ and $Z^4$ each independently represents a substituent necessary for the compound represented by the general formula (3) to become a dye.

In the photopolymerizable composition according to the third object, the compound represented by the general formula (3) is preferably a compound represented by the following general formula (5):

General formula (5)

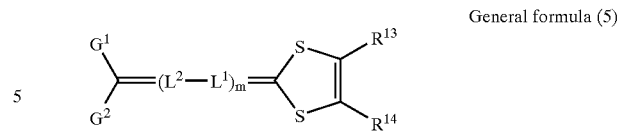

In the general formula (5), $L^1$ and $L^2$ each independently represents a methine group which may be substituted; m represents an integer of 0 to 3; and $G^1$ and $G^2$ each independently represents an electron-withdrawing group, or $G^1$ and $G^2$ join together to form an aromatic ring or a heterocycle.

In the photopolymerizable compositions according to the second and third objects, the compound, which can interact with the compound represented by the general formula (2) or the compound represented by the general formula (3) to generate a radical, is preferably an organoboron compound represented by the following general formula (A):

General formula (A)

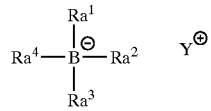

In the general formula (A), $R_a^1$, $R_a^2$, and $R_a^3$ each independently represents an aliphatic group, an aromatic group, a heterocyclic group, or $-SiR_a^5 R_a^6 R_a^7$ where $R_a^5$, $R_a^6$, and $R_a^7$ each independently represents an aliphatic group or an aromatic group; $R_a^4$ represents an aliphatic group; and $Y^+$ represents a group capable of forming a cation.

In order to solve the problems described above, the recording material according to the first object of the present invention comprises a support having disposed thereon a recording layer containing at least microcapsules enclosing a color-forming component and the photopolymerizable composition according to anyone of the first to third objects, wherein the polymerizable compound having an ethylenically unsaturated bond is a compound having a site which reacts with the color-forming component and causes the color-forming component to develop a color.

In order to solve the problems described above, the recording material according to the second object of the present invention comprises a support having disposed thereon a recording layer containing at least microcapsules enclosing a color-forming component, a color-forming compound which reacts with the color-forming component and causes the color-forming component to develop a color, and the photopolymerizable composition according to any one of the first to third objects, wherein the polymerizable compound having an ethylenically unsaturated bond is a color formation inhibiting compound having a site which inhibits the reaction between the color-forming component and the color-forming compound.

When the recording material of the first or second object is made into a recording material for the formation of multicolor images, the recording material can have a multilayer structure produced by laminating a first recording layer which is sensitive to the light having a central wave length of λ1, a second recording layer which is sensitive to the light having a central wave length of λ2 and develops a color different from the color of the first recording layer, . . . an i th recording layer which is sensitive to the light having a central wave length of λ1 and develops a color different from the colors of the first, second, . . . and (i−1)th recording layers, in the order listed.

DESCRIPTION OF PREFERRED EMBODIMENTS

Photopolymerizable Composition

The first object of the photopolymerizable composition of the present invention is a photopolymerizable composition comprising (1) a polymerizable compound having an ethylenically unsaturated bond, (2) a compound represented by the general formula (1) described above, and (3) an organoboron compound represented by the general formula (A) described above. The second object of the photopolymerizable composition of the present invention is a photopolymerizable composition comprising (1) a polymerizable compound having an ethylenically unsaturated bond, (2) a compound represented by the general formula (2) described above, and (3) a compound capable of interacting with the compound represented by the general formula (2) to generate a radical (hereinafter referred to as "radical generator"). The third object of the photopolymerizable composition of the present invention is a photopolymerizable composition comprising (1) a polymerizable compound having an ethylenically unsaturated bond, (2) a compound represented by the general formula (3) described above, and (3) a compound capable of interacting with the compound represented by the general formula (3) to generate a radical (hereinafter referred to as "radical generator").

When the photopolymerizable compositions according to the first to third objects are irradiated with light, the compounds represented respectively by the general formulae (1) to (3) absorb the light. As a result, in the first object, the organoboron compound represented by the general formula (A) interacts with the compound represented by the general formula (1) to generate a radical, while, in the second and third objects, the radical generator interacts respectively with the compound represented by the general formula (2) and the compound represented by the general formula (3) to generate a radical. The radical thus generated causes the radical polymerization of the polymerizable compound.

Details of the components contained in the photopolymerizable compositions according to the first to third objects are explained below.

(1) Polymerizable Compounds Having an Ethylenically Unsaturated Bond

The photopolymerizable compositions according to the first to third objects contain a polymerizable compound having an ethylenically unsaturated bond (hereinafter referred to as "polymerizable compound"). The polymerizable compound described above is a polymerizable compound having in the molecule thereof at least one ethylenically unsaturated double bond. The polymerizable compound is not particularly limited and appropriately selected in accordance with purposes. Examples of the polymerizable compound include derivatives of acrylic acid such as acrylates and acrylamides, acrylic acid and salts thereof, derivatives of methacrylic acid such as methacrylates and methacrylamides, methacrylic acid and salts thereof, maleic anhydride, maleates, itaconic acid, itaconates, styrenes, vinyl ethers, vinyl esters, N-vinyl heterocycles, allyl ethers, ally esters, and so on.

The polymerizable compound may contain one, or two or more, olefinic double bonds and may be any of a low molecular weight compound (i.e., monomeric compound) and a high molecular weight compound (i.e., oligomeric compound).

Examples of the monomer containing a double bond include alkyl or hydroxyalkyl acrylates or methacrylates such as methyl acrylate, ethyl acrylate, butyl acrylate, 2-ethylhexyl acrylate, 2-hydroxyethyl acrylate, isobornyl acrylate, methyl methacrylate, and ethyl methacrylate. In addition, silicone acrylates are advantageous.

Other examples include acrylonitrile, acrylamide, methacrylamide, N-substituted (meth)acrylamide, vinyl esters such as vinyl acetate, vinyl ether such as isobutyl vinyl ether, styrene, alkyl- and halostyrene, N-vinylpyrrolidone, vinyl chloride, vinylidene chloride, and so on.

Examples of the monomer containing two or more double bonds include a diacrylate of ethylene glycol, propylene glycol, neopentyl glycol, hexamethylene glycol, bisphenol A, or the like, 4,4'-bis(2-acylolyloxyethoxy) diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate, and tris(2-acryloylethyl) isocyanurate.

Examples of multi-unsaturated compound having a relatively high molecular weight (i.e., oligomeric compound) include epoxy resins having a (meth)acryl group, polyesters having a (meth)acryl group, polyesters containing a vinyl ether or epoxy group, polyurethanes, and polyethers. Examples of the unsaturated oligomer include unsaturated polyester resins which are normally produced from maleic acid, phthalic acid, and one or more diols and which have a molecular weight of about 500 to 3000. In addition, it is also possible to use vinyl ether monomers and oligomers, and oligomers which have polyester, polyurethane, polyether, polyvinyl ether, or epoxy main chains and are endstopped with maleate. Particularly suitable is a combination of an oligomer having a vinyl ether group and a polymer described in WO90/01512. Also suitable is a copolymer of vinyl ether and a maleic acid-functionalized monomer. These oligomers may belong to prepolymers.

Particularly suitable examples include a polyester of an ethylenically unsaturated carboxylic acid and a polyol or a polyepoxide, a polymer having in the main or side chain thereof an ethylenically unsaturated group such as an unsaturated polyester, polyamide, or polyurethane as well as a copolymer thereof, an alkyd resin, a polybutadiene and a butadiene copolymer, a polyisoprene and an isoprene copolymer, a polymer and copolymer having in the side chain thereof a (meth)acryl group, and a mixture of one or more of these polymers.

Examples of the unsaturated carboxylic acid include unsaturated fatty acids such as acrylic acid, methacrylic acid, crotonic acid, itaconic acid, cinnamic acid, linoleic acid, and oleic acid. Among these acids, acrylic acid and methacrylic acid are preferred.

Aromatic polyols, and aliphatic and alicyclic polyols in particular, are suitable as the polyol. Examples of the aromatic polyols include hydroquinone, 4,4'-dihydroxydiphenyl, 2,2'-di(4-hydroxydiphenyl)propane, novolak, and resorcinol. Examples of the polyepoxides are those based on polyols, aromatic polyols in particular, and those based on epichlorohydrin. Examples of other suitable polyols are polymers and copolymers having in the polymer chain or side chain thereof a hydroxyl group such as polyvinyl alcohol or copolymers thereof, or polyhydroxyalkyl methacrylate or copolymers thereof. In addition, an oligoester having a hydroxyl terminal group is also suitable as the polyol.

Examples of the aliphatic and alicyclic polyols are preferably alkylene diols having 2 to 12 carbon atoms such as ethylene glycol, 1,2- or 1,3-propanediol, 1,2-, 1,3-, or 1,4-butanediol, pentanediol, hexanediol, octanediol, dodecanediol, diethylene glycol, triethylene glycol, preferably polyethylene glycol having a molecular weight of 200 to 1500, 1,3-cyclopentanediol, 1,2-, 1,3-, or 1,4-cyclohexanediol, 1,4-dihydroxymethylcyclohexane, glycerol, tris(β-hydroxyethyl)amine, trimethylolethane, pentaerythritol, dipentaerythritol, and sorbitol.

The polyol can be partially or completely esterified by one carboxylic acid or by different unsaturated carboxylic acids. In the partially esterified product, the free hydroxyl group can be modified. For example, the free hydroxyl group can be etherified or esterified by other carboxylic acid.

Examples of the ester include the following compounds. That is, trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritolhexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate and methacrylate, glycerol diacrylate and triacrylate, 1,4-cyclohexane diacrylate, bisacrylate and bismethacrylate of polyethylene glycol having a molecular weight of 200 to 1500, and mixtures of the foregoing compounds.

In addition, suitable as the polymerizable compound described above are amides made up of the same or different unsaturated carboxylic acids and aromatic, alicyclic, or aliphatic polyamines having preferably 2 to 6, particularly preferably 2 to 4, amino groups.

Examples of such polyamines include ethylenediamine, 1,2- or 1,3-propylenediamine, 1,2- 1,3-, or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-β-aminoethyl ether, diethylene triamine, triethylene tetramine, di(β-aminoethoxy)- or di(β-aminopropoxy)ethane. Also suitable are polymers and copolymers having an additional amino group preferably in the side chain and oligo-amides having terminal amino groups. Examples of such unsaturated amides include methylenebisacrylamide, 1,6-hexamethylenebisacrylamide, 1,6-hexamethylenebisacrylamide, diethylenetriaminetrismethacrylamide, bis(methacrylamidepropoxy)ethane, β-methacrylamide ethylmethacrylate, N-[(β-hydroxyethoxy)ethyl]acrylamide, and so on.

Suitable unsaturated polyesters and polyamides can be derived, for example, from maleic acid and from diols or diamines. Part of the maleic acid can be replaced by other dicarboxylic acid. These can be used together with an ethylenically unsaturated comonomer, for example, styrene. The polyesters and polyamides can be derived from dicarboxylic acid and from ethylenically unsaturated diols or diamines, particularly those having a relatively long chain, for example, of 6 to 20 carbon atoms. Examples of polyurethane include one made up of a saturated or unsaturated diisocyanate and a saturated or unsaturated diol.

Polybutadiene and polyisoprene as well as copolymers thereof are conventionally known. Examples of suitable comonomers are olefins, such as ethylene, propene, butene, and hexene, (meth)acrylate, acrylonitrile, styrene, and vinyl chloride. Similarly, polymers having in the side chain thereof a (meth)acrylate group are also known. For example, these polymers can be obtained as a reaction product from a novolak-based epoxy resin and (meth)acrylic acid. Alternatively, these polymers may be a homopolymer or a copolymer of a hydroxyalkyl derivative produced by esterification with vinyl alcohol or (meth)acrylic acid; or a homopolymer or a copolymer of a (meth)acrylate produced by esterification with a hydroxyalkyl (meth)acrylate.

In accordance with the uses of the photopolymerizable composition according to the first or second object, the polymerizable compound described above may be a compound having in the structure thereof a site which exhibits other functions. For example, the polymerizable compound may have a site which accelerates the color-forming reaction or may have a site which inhibits the color-forming reaction of the color-forming component constituting the image portions when the photopolymerizable composition according to the first or second object is used in a recording material. This will be described later.

The content of the above-mentioned polymerizable compound having an ethylenically unsaturated bond is normally 10 to 99% by weight, preferably 30 to 95% by weight, of the total weight of photopolymerizable composition.

(2) Compounds Represented by the General Formulae (1) to (3)

The compounds represented by the general formulae (1) to (3) contained in each of the photopolymerizable compositions according to the first to third objects are neutral organic dyes having no counter anion in the structure thereof. In the photopolymerizable composition according to the first object, the compound represented by the general formula (1) has a function of spectrally sensitizing the generation of a radical from the organoboron compound represented by the general formula (A). In the photopolymerizable compositions according to the second and third objects, the compounds represented by the general formula (2) and the general formula (3), respectively, have a function of spectrally sensitizing the radical generator. That is, when the compounds represented by the general formulae (1) to (3) are incorporated in the compositions and the compositions are irradiated with visible to infrared light corresponding to the absorption by these compounds, the generation of a radical from the organoboron compound or the radical generator can be accelerated even if the organoboron compound or radical generator that is contained has no absorption in the above-mentioned region. In addition, since the compounds represented by the general formulae (1) to (3) exhibit a high-level of decolorization when irradiated with light having wavelengths of 350 nm or greater, the recording materials and the like utilizing the photopolymerizable compositions according to the first to third objects can form high-contrast and clear images because the fogging in the background is inhibited.

(2)-1 Compounds Represented by the General Formula (1)

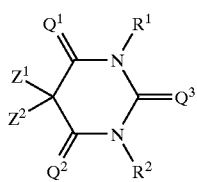

General formula (1)

In the general formula (1), $Q^1$ to $Q^3$ each independently represents an oxygen atom or a sulfur atom. In particular, it is preferable that $Q^1$ and $Q^2$ are each an oxygen atom, and $Q^3$ is a sulfur atom.

In the general formula (1), $R^1$ and $R^2$ each independently represents a hydrogen atom, an aliphatic group, an aromatic group, or a heterocyclic group. When $R^1$ and $R^2$ each independently represents an aliphatic group, examples of the aliphatic group include an alkyl group, a substituted alkyl group, an alkenyl group, a substituted alkenyl group, an alkynyl group, a substituted alkynyl group, an aralkyl group, and a substituted aralkyl group. Among these groups, analkyl group, a substituted alkyl group, an alkenyl group, a substituted alkenyl group, an aralkyl group, and a substituted aralkyl group are preferable; and an alkyl group and a substituted alkyl group are particularly preferable.

The aliphatic group may be an alicyclic group or a chain-like aliphatic group. The chain-like aliphatic group may be branched.

Examples of the alkyl group include a straight-chain alkyl group, a branched alkyl group, and a cyclic alkyl group. The number of carbon atoms in the alkyl group is preferably 1 to 30 and more preferably 1 to 20. The range of the preferable number of carbon atoms in the alkyl portion of the substituted alkyl group is the same as in the alkyl group. The alkyl group may be an alkyl group having a substituent or an alkyl group having no substituent.

Examples of the alkyl group include methyl, ethyl, propyl, butyl, pentyl, hexyl, octyl, 2-ethylhexyl, decyl, dodecyl, octadecyl, cyclohexyl, cyclopentyl, neopentyl, isopropyl, and isobutyl groups.

Specific examples of the substituent of the substituted alkyl group include the following groups. A carboxyl group, a sulfo group, a cyano group, a halogen atom (e.g., a fluorine, chlorine, or bromine atom), a hydroxyl group, an alkoxycarbonyl group having 30 or less carbon atoms (e.g., a methoxycarbonyl, ethoxycarbonyl, or benzyloxycarbonyl group), an alkylsulfonylaminocarbonyl group having 30 or less carbon atoms, an arylsulfonylaminocarbonyl group, an alkylsulfonyl group, an arylsulfonyl group, an acylaminosulfonyl group having 30 or less carbon atoms, an alkoxy group having 30 or less carbon atoms (e.g., a methoxy, ethoxy, benzyloxy, phenoxyethoxy, or phenethyloxy group), an alkylthio group having 30 or less carbon atoms (e.g., a methylthio, ethylthio, or methylthioethylthioethyl group), an aryloxy group having 30 or less carbon atoms (e.g., a phenoxy, p-tolyloxy, 1-naphthoxy, or 2-naphthoxy group), a nitro group, an alkyl group having 30 or less carbon atoms, an alkoxycarbonyloxy group, an aryloxycarbonyloxy group, an acyloxy group having 30 or less carbon atoms (e.g., an acetyloxy or propionyloxy group), an acyl group having 30 or less carbon atoms (e.g., an acetyl, propionyl, or benzoyl group), a carbamoyl group (e.g., a carbamoyl, N,N-dimethylcarbamoyl, morpholinocarbamoyl, or piperidinocarbamoyl group), a sulfamoyl group (e.g., a sulfamoyl, N,N-dimethylsulfamoyl, morpholinosulfamoyl, or piperidinosulfamoyl group), an aryl group having 30 or less carbon atoms (e.g., a phenyl, 4-chlorophenyl, 4-methylphenyl, or α-naphthyl group), a substituted amino group (e.g., an amino, alkylamino, dialkylamino, arylamino, diarylamino, or acylamino group), a substituted ureido group, a substituted phosphono group, a heterocyclic group, and so on. In the examples listed above, the carboxyl group, sulfo group, hydroxyl group, and phosphono group may be in the state of salts. In this case, examples of the cation constituting the salts include $Y^+$ and the like which are described later.

Examples of the alkenyl group include a straight-chain alkenyl group, a branched alkenyl group, and a cyclic alkenyl group. The number of carbon atoms in the alkenyl group is preferably 2 to 30 and more preferably 2 to 20. The range of the preferable number of carbon atoms in the alkenyl portion of the substituted alkenyl group is the same as in the alkenyl group. The alkenyl group may be an alkenyl group having a substituent or an alkenyl group having no substituent.

Examples of the substituents of the substituted alkenyl groups include the same substituents as in the case of the substituted alkyl groups.

Examples of the alkynyl group include a straight-chain alkynyl group, a branched alkynyl group, and a cyclic alkynyl group. The number of carbon atoms in the alkynyl group is preferably 2 to 30 and more preferably 2 to 20. The range of the preferable number of carbon atoms in the alkynyl portion of the substituted alkynyl group is the same as in the alkynyl group. The alkynyl group may be an alkynyl group having a substituent or an alkynyl group having no substituent.

Examples of the substituents of the substituted alkynyl groups include the same substituents as in the case of the substituted alkyl groups.

Examples of the aralkyl group include a straight-chain aralkyl group, a branched aralkyl group, and a cyclic aralkyl group. The number of carbon atoms in the aralkyl group is preferably 7 to 35 and more preferably 7 to 25. The range of the preferable number of carbon atoms in the aralkyl portion of the substituted aralkyl group is the same as in the aralkyl group. The aralkyl group may be an aralkyl group having a substituent or an aralkyl group having no substituent.

Examples of the substituents of the substituted aralkyl groups include the same substituents as in the case of the substituted alkyl groups.

When $R^1$ and $R^2$ each represents an aromatic group, examples of the aromatic group include an aryl group and a substituted aryl group. The number of carbon atoms in the aryl group is preferably 6 to 30 and more preferably 6 to 20. The range of the preferable number of carbon atoms in the aryl portion of the substituted aryl group is the same as in the aryl group. Examples of the aryl group include a phenyl group, an α-naphthyl group, and a β-naphthyl group.

Examples of the substituents of the substituted aryl groups include the same substituents as in the case of the substituted alkyl groups.

When $R^1$ and $R^2$ each represents a heterocyclic group, examples of the heterocyclic ring group include a heterocyclic group having a substituent and a heterocyclic group having no substituent. The heterocyclic group represented by $R^1$ or $R^2$ is preferably a heterocyclic group having 4 to 13 carbon atoms. Examples of such heterocyclic group include a nitrogen atom-containing heterocyclic group, an oxygen atom-containing heterocyclic group, and a sulfur atom-containing heterocyclic group. Specific examples thereof include a pyridine ring, a pyridazine ring, a pyrimidine ring, a pyridazoline ring, a quinoline ring, an isoquinoline ring, a quinoxaline ring, an acridine ring, a furan ring, an oxazole ring, a thiazole ring, an oxadiazole ring, a thiazoline ring, a thiophene ring, an indole ring, and so on. When $R^1$ and $R^2$ each represents a heterocyclic group having a substituent, examples of the substituent include the same substituents as the substituents of $R^1$ and $R^2$ when $R^1$ and $R^2$ have substituents.

In particular, $R^1$ and $R^2$ are preferably an unsubstituted alkyl group (e.g., a methyl, ethyl, n-propyl, n-butyl, n-pentyl, n-hexyl, octyl, or octadecyl group) or a substituted alkyl group. Preferable substituted alkyl groups are an alkoxyalkyl group (e.g., a methoxyethyl or phenoxyethyl group) and an alkoxycarbonylalkyl group (e.g., a butoxycarbonylmethyl or phenoxyethocycarbonylmethyl group). In addition, $R^1$ and $R^2$ each may combine with an adjacent other substituent to form a ring. Examples of such ring include 5- or 6-membered heterocylces.

In the general formula (1), $Z^1$ and $Z^2$ each independently represents a substituent necessary for the compound represented by the general formula (1) to become a dye. Example of the substituent include a group capable of forming a conjugated chain.

Among the compounds represented by the general formula (1), compounds represented by the general formula (4) are preferable.

General formula (4)

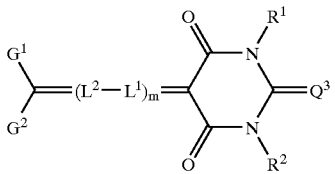

In the general formula (4), $L^1$ and $L^2$ each independently represents a methine group which may be substituted. When $L^1$ and $L^2$ each represents a methine group, examples of the methine group include a methine group having a substituent and an unsubstituted methine group. When $L^1$ and $L^2$ each represents a methine group having a substituent, examples of the substituent include the same substituents as the substituents of $R^1$ and $R^2$ when $R^1$ and $R^2$ have substituents. Such a substituent may form a ring with (e.g., a 5- or 6-membered ring) other methine group, or may form a ring with an auxochrome.

In the general formula (4), $G^1$ and $G^2$ each independently represents an electron-withdrawing group, or $G^1$ and $G^2$ join together to form an aromatic ring or a heterocycle. The electron-withdrawing group represented by $G^1$ or $G^2$ means a substituent whose Hammett σ value is a positive one. Examples of the electron-withdrawing group represented by $G^1$ or $G^2$ include an acyl group, such as an acetyl, propionyl, pivaloyl, chloroacetyl, trifluoroacetyl, 1-methylcyclopropylcarbonyl, 1-ethylcyclopropylcarbonyl, 1-benzylcyclopropylcarbonyl, benzoyl, 4-methoxybenzoyl, or thenoyl group, an oxycarbonyl group, such as a methoxycarbonyl, ethoxycarbonyl, 2-methoxyethoxycarbonyl, or 4-methoxypheoxycarbonyl group, a carbamoyl group, such as a carbamoyl, N,N-dimethylcarbamoyl, N,N-diethylcarbamoyl, N-phenylcarbamoyl, N-2,4,-bis (pentyloxy)phenylcarbamoyl, N-2,4,-bis(octyloxy) phenylcarbamoyl, or morpholinocarbamoyl group, a cyano group, a sulfonyl group such as a toluenesulfonyl group, a phosphono group such as a diethylphosphono group, and a heterocyclic group such as a benzooxazole-2-yl, benzothiazole-2-yl, 3,4,-dihydroquinazoline-4-one-2-yl, or 3,4,-dihydroquinazoline-4-sulfone-2-yl group.

When $G^1$ and $G^2$ join together to form an aromatic ring, examples of the ring include benzene, naphthalene, anthracene, and so on.

When $G^1$ and $G^2$ join together to form a heterocycle, examples of the heterocycle include 5- or 6-membered heterocycles. Examples of the nuclei of the 5- or 6-membered heterocycles made up of $G^1$ and $G 2$ are as follows: Thiazole nuclei (e.g., thiazole, 4-methylthiazole, 4-phenylthiazole, and 4,5-dichlorothiazole), benzothiazole nuclei (e.g., 4-chlorobenzothiazole, 5-chlorobenzothiazole, 6-chlorobenzothiazole, 5-nitrobenzothiazole, 5-methylbenzothiazole, 5-phenylbenzothiazole, 5-ethoxybenzothiazole, 5-ethoxycarbonylbenzothiazole, 5-phenoxybenzothiazole, 5-fluorobenzothiazole, 5-trifluoromethylbenzothiazole, 5-chloro-6-methylbenzothiazole, tetrahydrobenzothiazole, 4-phenylbenzothiazole, and 5,6-bismethythiobenzothiazole) naphthothiazole nuclei (e.g., naphtho[2,1-d]thiazole, naphtho[1,2-d]thiazole, naphtho[2,3-d]thiazole, 5-methoxynaphtho[1,2-d]thiazole, 7-ethoxynaphtho[2,1-d]thiazole, 8-methoxynaphtho[2,1-d]thiazole, 5-methoxynaphtho[2,3-d]thiazole, 8-methylthionaphtho[2,1-d]thiazole), thiazoline nuclei (e.g., thiazoline, 4-methylthiazoline, and 4-nitrothiazoline), oxazole nuclei (e.g., oxazole, 4-methyloxazole, 4-nitrooxazole, 4-phenyloxazole, 4,5-diphenyloxazole, and 4-ethyloxazole), benzoxazole nuclei (e.g., benzoxazole, 5-chlorobenzoxazole, 5-methylbenzoxazole, 5-fluorobenzoxazole, 5-phenylbenzoxazole, 5-nitrobenzoxazole, 5-trifluoromethylbenzoxazole, and 5-acetylbenzoxazole), naphthoxazole nuclei (e.g., naphtho[2,1-d]oxazole, naphtho[1,2-d]oxazole, naphtho[2,3-d] oxazole, and 5-nitronaphtho[2,1-d]oxazole), oxazoline nuclei (e.g., 4,4-dimethyloxazoline), selenazole nuclei (e.g., selenazole, 4-methylselenazole, 4-nitroselenazole, and 4-phenylselenazole), benzoselenazole nuclei (e.g., benzoselenazole, 5-chlorobenzoselenazole, 5-nitrobenzoselenazole, 6-nitrobenzoselenazole, 6-chloro-6-nitrobenzoselenazole, and 5,6-dimethylbenzoselenazole), naphthoselenazole nuclei (e.g., naphtho[2,1-d]selenazole and naphthol[1,2-d]selenazole, selenazoline nuclei (e.g., selenazoline and 4-methylselenazoline), tellurazole nuclei (e.g., tellurazole, 4-methyltellurazole, and 4-phenyltellurazole), benzotellurazole nuclei (e.g., benzotellurazole, 5-chlorobenzotellurazole, 5-methylbenzotellurazole, 5,6-dimethylbenzotellurazole, and 6-methoxylbenzotellurazole), naphtotellurazole nuclei (e.g., naphto[2,1d]tellurazole and naphto[1,2d]tellurazole), tellurazoline nuclei (e.g., tellurazoline and 4-methyltellurazoline), 3,3-dialkylindolenine nuclei (e.g., 3,3-dimethylindolenine, 3,3-diethylindolenine, 3,3-dimethyl-5-cyanoindolenine, 3,3-dimethyl-6-nitroindolenine, 3,3-dimethyl-5-nitroindolenine, 3,3-dimethyl-5-methoxyindolenine, 3,3,5-trimethylindolenine, and 3,3-dimethyl-5-chloroindolenine), imidazole nuclei (e.g., imidazole, 1-alkylimidazole, 1-alkyl-4-phenylimidazole, and 1-arylimidazole), benzoimidazole nuclei (e.g., 1-alkylbenzoimidazole, 1-alkyl-5-chlorobenzoimidazole, 1-alkyl-5,6-dichlorobenzoimidazole, 1-alkyl-5-cyanobenzoimidazole, and 1-alkyl-5-cyanobenzoimidazole, 1-alkyl-5-fluorobenzoimidazole, 1-alkyl-5-trifluoromethylbenzoimidazole, 1-alkyl-6-chloro-5-cyanobenzoimidazole, 1-alkyl-6-chloro-5-trifluoromethylbenzoimidazole, 1-allyl-5,6-dichlorobenzoimidazole, and 1-arylbenzoimidazole), and naphtoimidazole nuclei (e.g., 1-alkylnaphto[1,2-d] imidazole). In the imidazole nuclei listed above, preferable as the alkyl groups are alkyl groups having 1 to 8 carbon atoms such as unsubstituted alkyl groups, e.g., methyl, ethyl, propyl, isopropyl, and butyl groups, and hydroxyalkyl groups, e.g., 2-bydroxyethyl and 3-hydroxypropyl groups; and particularly preferable are methyl and ethyl groups. In the imidazole nuclei listed above, examples of the aryl groups include phenyl, halogen (e.g., chloro)-substituted phenyl, alkyl (e.g., methyl)-substituted phenyl, and alkoxy (e.g., methoxy)-substituted phenyl groups.

Other examples of the 5- or 6-membered heterocyclic nuclei formed by G and $G^2$ are as follows: Dithiol nuclei (e.g., 1,3-dithiol, 4-chloro-1,3-dithizol, 4,5-dialkoxycarbonyl-1,3-dithiol, 4,5-benzo-dithiol-1,3-dithiol, and 4,5-naphto-1,3-dithiol), dithiolane nuclei (e.g., 1,3-dithiolane and 4-fluoro-1,3-dithiolane), dioxol nuclei (e.g., 1,3-dioxol and 4-methyl-1,3-dioxol, 4,5-benzo-1,3-dioxol, and 4,5-naphto-1,3-dioxol), and dioxolane nuclei (e.g., 1,3-dioxolane and 4-trifluoromethyl-1,3-dioxolane) In the dithiol nuclei listed above, preferable as the alkoxycarbonyl groups are alkoxycarbonyl groups having 2 to 8 carbon atoms such as methoxycarbonyl, ethoxycarbonyl, and butoxycarbonyl groups.

Yet other examples of the 5- or 6-membered heterocyclic nuclei formed by $G^1$ and $G^2$ are as follows: Pyridine nuclei (e.g., 2-pyridine, 4-pyridine, 5-methyl-2-pyridine, and 3-methyl-4-pyridine), quinoline nuclei (e.g., quinoline, 2-quinoline, 3-methyl-2-quinoline, 5-ethyl-2-quinoline, 6-methyl-2-quinoline, 6-nitro-2-quinoline, 8-fluoro-2-quinoline, 6-methoxy-2-quinoline, 6-hydroxy-2-quinoline, 8-chloro-2-quinoline, 4-quinoline, 6-ethoxy-4-quinoline, 6-nitro-4-quinoline, 8-chloro-4-quinoline, 8-fluoro-4-quinoline, 8-methyl-4-quinoline, 8-methoxy-4-quinoline, 6-methyl-4-quinoline, 6-methoxy-4-quinoline, 6-chloro-4-quinoline, and 5,6-dimethyl-4-quinoline), isoquinoline nuclei (e.g., 6-nitro-1-isoquinoline, 3,4-dihydro-1-isoquinoline, and 6-nitro-3-isoquinoline), imidazo[4,5-b]quinoxaline nuclei (e.g., 1,3-diethylimidazo[4,5-b]quinoxaline, 6-chloro-1,3-diallylimidazo[4,5-b]quinoxaline, 6-chloro-1,3-dibenzylimidazo[4,5-b]quinoxaline, 6-chloro-1,3-diphenylimidazo[4,5-b]quinoxaline, and 6-nitro-1,3-diallylimidazo[4,5-b]quinoxaline, oxadiazole nuclei, thiadiazole nuclei, pyrimidine nuclei, imidazo[4,5-b]pyrazine nuclei (e.g., 1,3-diethyl[4,5-b]pyrazine and 1,3-diallyl[4,5-b]pyrazine, imidazo[4,5-b]1,4-quinone nuclei, pyrrolopyridine nuclei, pyrazolopyridine nuclei, 1,3,3a,7-tetraazaindene nuclei, indolizine nuclei, 1,8-naphthilizine nuclei, pyran nuclei (e.g., an α-pyran, ν-pyran, benzo-α-pyran, and benzo-ν-pyran), thiapyran nuclei (e.g., an α-thiapyran, ν-thiapyran, benzo-α-thiapyran, and benzo-ν-thiapyran), indolenine nuclei

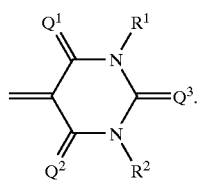

In the general formula (4), m represent an integer of 0 to 3.

(2)-2 Compounds Represented by the General Formula (2)

General formula (2)

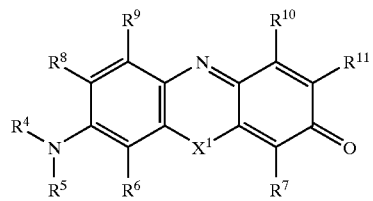

In the general formula (2), $X^1$ represents $NR^{12}$, a sulfur atom, a selenium atom, or an oxygen atom. Among these, $X^1$ is preferably a sulfur atom or an oxygen atom.

In the general formula (2), $R^4$, $R^5$, and $R^{12}$ each represents a hydrogen atom, an aliphatic group, an aromatic group, or a heterocyclic group. The aliphatic group, the aromatic group, and the heterocyclic group represented by $R^4$, $R^5$, and $R^{12}$ are the same, respectively, as the aliphatic group, the aromatic group, and the heterocyclic group represented by $R^1$ and $R^2$ of the general formula (1). The same holds true for preferred examples thereof.

In the general formula (2), $R^6$, $R^7$, $R^8$, $R^9$, $R^{10}$, and $R^{11}$ each independently represents a hydrogen atom or a monovalent substituent. Examples of the monovalent substituent are as follows: A substituted or unsubstituted alkyl group (e.g., a methyl, ethyl, propyl, butyl, hydroxyethyl, trifluoromethyl, benzyl, sulfopropyl, diethylaminoethyl, cyanopropyl, adamantyl, p-chlorophenethyl, ethoxyethyl, ethylthioethyl, phenoxyethyl, carbamoylethyl, carboxyethyl, ethoxycarbonylmethyl, or acetylaminoethyl group), a substituted or unsubstituted alkenyl group (an allyl or styryl group), a substituted or unsubstituted aryl group (e.g., a phenyl, naphthyl, p-carboxyphenyl, 3,5-dicarboxyphenyl, m-sulfophenyl, p-acetamidopehnyl, 3-caprylamidophenyl, p-sulfamoylphenyl, m-hydroxyphenyl, p-nitrophenyl, 3,5-dichlorophenyl, p-anisyl, o-anisyl, p-cyanophenyl, p-N-methylureidophenyl, m-fluorophenyl, p-tolyl, or m-tolyl group), a substituted or unsubstituted heterocyclic group (e.g., a pyridyl, 5-methyl-2-pyridyl, or thienyl group), a halogen atom (e.g., a chlorine, bromine, or fluorine atom), a mercapto group, a cyano group, a carboxyl group, a sulfo group, a hydroxyl group, a carbamoyl group, a sulfamoyl group, a nitro group, a substituted or unsubstituted alkoxy group (e.g., a methoxy, ethoxy and 2-methoxyethoxy, or 2-phenylethoxy group), a substituted or unsubstituted aryloxy group (e.g., a phenoxy, p-methylphenoxy, p-chlorophenoxy, or α-naphthoxy group), a substituted or unsubstituted acyl group (e.g., an acetyl or benzoyl group), a substituted or unsubstituted acylamino group (e.g., an acetylamino or caproylamino group), a substituted or unsubstituted sulfonyl group (e.g., a methanesulfonyl or benzenesulfonyl group), a sulfonylamino group (e.g., a methanesulfonylamino or benzenesulfonylamino group), a substituted or unsubstituted amino group (a diethylamino or hydroxyamino group), an alkylthio or aryl thio group (e.g., a methylthio, carboxyethylthio, sulfobutylthio, or phenylthio group), an alkoxycarbonyl group (e.g., a methoxycarbonyl), an aryloxycarbonyl group (e.g., a phenoxycarbonyl group), and so on.

Further, these substituents may have thereon substituents such as an alkyl group, an alkenyl group, an aryl group, a hydroxyl group, a carboxyl group, a sulfo group, a nitro group, a cyano group, a halogen atom, an alkoxy group, an aryloxy group, an alkoxycarbonyl group, an acyl group, an amino group, a sulfonamino group, a carbamoyl group, a sulfamoyl group, and the like.

Preferably, $R^6$ and $R^7$ are each a hydrogen atom, an alkyl group (e.g., a methyl or ethyl group), or an electron-withdrawing group. The term "an electron-withdrawing group" as used herein means a group whose Hammett σ value is a positive one. The above-mentioned σ value is described, for example, in "Introduction to the Studies on the Activity Correlation of Drugs—Drug Design and Difference in Acting Groups" (Yakubutsu no Kassei Sokan to Sayoo Kisa Kenkyu eno Shishin) edited by Forum to discuss Structural Activity Correlation (Koozo Rassei Sookan Konwa Kai) on page 122 of special edition of "The Domain of Chemistry" (Kagaku no Ryooiki), Nanko Do Co., Ltd., Corwin Hansch and Albert Leo: "Substituent Constants for Correlation Analysis in Chemistry and Biology", pp.69–161, John Wiley and Sons, and Corwin Hansch, A. Leo, and R. W. Taft: "Chemical Reviews", Vol. 91, pp.165–195.

If the $\sigma_p$ value of a substituent is not known, the σ value can be obtained by the measurement according to the method described in "Chemical Reviews", Vol. 17, pp.125–136 (1935).

$R^9$ and $R_{10}$ are preferably a hydrogen atom, an alkyl group (e.g., a methyl or ethyl group), or an aryl group (e.g., a phenyl group). $R^8$ and $R^{11}$ are preferably a hydrogen atom, an alkyl group (e.g., a methyl or ethyl group), an aryl group (e.g., a phenyl group), or an electron-withdrawing group. Two or more of $R^6$, $R^7$, $R^8$, $R^9$, $R^{10}$, $R^{11}$ and $R^{12}$ may join together to form a ring. For example, $R^8$ and $R^9$, and $R^{10}$ and $R^{11}$ may join together to form a ring such as a benzene ring.

(2)-3 Compounds Represented by the General Formula (3)

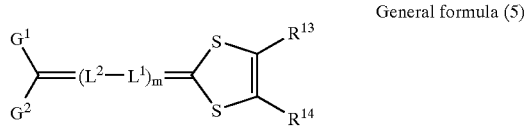

General formula (3)

In the general formula (3), $R^{13}$ and $R^{14}$ each independently represents a hydrogen atom or a monovalent substituent. Examples of the monovalent substituent are as follows: A substituted or unsubstituted alkyl group (e.g., a methyl, ethyl, propyl, butyl, hydroxyethyl, trifluoromethyl, benzyl, sulfopropyl, diethylaminoethyl, cyanopropyl, adamantyl, p-chlorophenethyl, ethoxyethyl, ethylthioethyl, phenoxyethyl, carbamoylethyl, carboxyethyl, ethoxycarbonylmethyl, or acetylaminoethyl group), a substituted or unsubstituted aryl group (e.g., a phenyl, naphthyl, p-carboxyphenyl, 3,5-dicarboxyphenyl, m-sulfophenyl, p-acetamidopehnyl, 3-caprylamidophenyl, p-sulfamoylphenyl, m-hydroxyphenyl, p-nitrophenyl, 3,5-dichlorophenyl, p-anisyl, o-anisyl, p-cyanophenyl, p-N-methylureidophenyl, m-fluorophenyl, p-tolyl, or m-tolyl group), a substituted or unsubstituted alkylthio or a substituted or unsubstituted aryl thio group (e.g., a methylthio, ethylthio, sulfobutylthio, orphenylthio group), a halogen atom (e.g., a chlorine, bromine, or fluorine atom), a carbamoyl group, a sulfamoyl group, a substituted or unsubstituted acyl group (e.g., an acetyl or benzoyl group) a substituted or unsubstituted alkoxycarbonyl group (e.g., a methoxycarbonyl group), a substituted or unsubstituted aryloxycarbonyl group (e.g., a phenoxycarbonyl group), a carboxyl group, a formyl group, a substituted amino group, a nitrile group, and so on. In the general formula (3), $R^{13}$ and $R^{14}$ may join together to form an aromatic ring or a heterocycle.

In the general formula (3), $Z^3$ and $Z^4$ each independently represents a substituent necessary for the compound represented by the general formula (3) to become a dye. Examples of the substituents represented by $Z^3$ and $Z^4$ include groups capable of forming a conjugated chain.

Among the compounds represented by the general formula (3), compounds represented by the following general formula (5) are preferable:

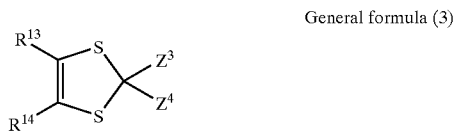

General formula (5)

In the general formula (5), $L^1$ and $L^2$ each independently represents a methine group which may be substituted. The methine groups represented by $L^1$ or $L^2$ of the general formula (5) are the same as those represented by $L^1$ or $L^2$ in the general formula (4). The same holds true for preferred examples thereof. In the general formula (5), $G^1$ and $G^2$ each independently represents an electron-withdrawing group, or $G^1$ and $G^2$ join together to form an aromatic ring or a heterocycle. The electron-withdrawing groups represented by $G^1$ or $G^2$ of the general formula (5) are the same as those represented by $G^1$ or $G^2$ of the general formula (4). The same holds true for preferred examples thereof. When $G^1$ and $G^2$ join together to form an aromatic ring or a heterocycle, the examples of aromatic ring or the heterocycle include the same examples of the aromatic ring or the heterocycle (heterocyclic nucleus) listed as the examples when $G^1$ and $G^2$ of the general formula (4) join together to form an aromatic ring or a heterocycle. In the general formula (5), m represents an integer of 0 to 3.

Exemplary compounds 1 to 115 represented by the general formulae (1) to (3) are given below. However, it should be noted the compounds to be used in the present invention are not limited the following exemplary compounds.

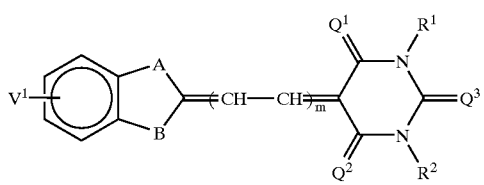

| Exemplary compound No. | A | B | $Q^1$ | $Q^2$ | $Q^3$ | $V^1$ | $R^1$—$R^2$ | m |
|---|---|---|---|---|---|---|---|---|
| 1 | S | N—$^nC_8H_{17}$ | O | O | S | H | $C_2H_5$ | 0 |
| 2 | O | N—$C_2H_5$ | O | O | S | H | $^nC_4H_9$ | 0 |
| 3 | N—$C_2H_5$ | N—$C_2H_5$ | O | O | S | H | $^nC_4H_9$ | 0 |
| 4 | S | N—$^nC_8H_{17}$ | O | O | O | 5-Cl | $C_2H_5$ | 0 |
| 5 | Se | N—$C_2H_5$ | O | O | S | H | $C_2H_5$ | 0 |

-continued

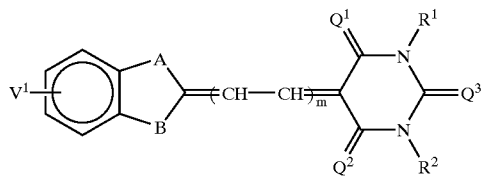

| Exemplary compound No. | A | B | $Q^1$ | $Q^2$ | $Q^3$ | $V^1$ | $R^1$—$R^2$ | m |
|---|---|---|---|---|---|---|---|---|
| 6 | S | N—$C_2H_5$ | O | O | S | 4,5-Ph | $C_2H_5$ | 0 |
| 7 | S | S | O | O | S | H | $C_2H_5$ | 0 |
| 8 | S | S | O | O | S | 5,6-$Cl_2$ | $C_2H_5$ | 0 |
| 9 | S | S | O | O | S | 5,6-$(CH_3OCO)_2$ | $C_2H_5$ | 0 |
| 10 | S | S | O | O | S | 5-$CF_3$ | $C_2H_5$ | 0 |
| 11 | S | S | O | O | S | 5-$SO_2CH_3$ | $C_2H_5$ | 0 |
| 12 | S | N—$C_2H_5$ | O | O | S | H | $^nC_4H_9$ | 1 |
| 13 | S | N—$C_2H_5$ | O | O | S | 5-Cl | $^nC_4H_9$ | 1 |
| 14 | O | N—$C_2H_5$ | O | O | S | H | $^nC_4H_9$ | 1 |
| 15 | O | N—$^nC_4H_9$ | O | O | S | 5-Cl | $^nC_4H_9$ | 1 |
| 16 | O | N—$^nC_4H_9$ | O | O | S | 5-$CF_3$ | $^nC_4H_9$ | 1 |
| 17 | O | N—$^nC_4H_9$ | O | O | S | 5-$SO_2CH_3$ | $^nC_4H_9$ | 1 |
| 18 | S | S | O | O | S | H | $C_2H_5$ | 1 |
| 19 | S | N—$C_2H_5$ | O | O | S | H | $C_2H_5$ | 2 |
| 20 | S | N—$C_2H_5$ | O | O | S | 5-$SO_2CH_3$ | $C_2H_5$ | 2 |
| 21 | O | N—$C_2H_5$ | O | O | S | 5-Cl | $C_2H_5$ | 2 |
| 22 | O | N—$C_2H_5$ | O | O | S | 5-$SO_2CH_3$ | $C_2H_5$ | 2 |
| 23 | S | S | O | O | S | 5-$SO_2CH_3$ | $C_2H_5$ | 2 |
| 24 | S | N—$C_2H_5$ | O | O | S | 5-Cl | $C_2H_5$ | 3 |
| 25 | S | N—$C_2H_5$ | O | O | S | 5-$SO_2CH_3$ | $C_2H_5$ | 3 |
| 26 | S | S | O | O | S | 5-$SO_2CH_3$ | $C_2H_5$ | 3 |

Ph = 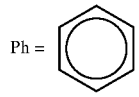

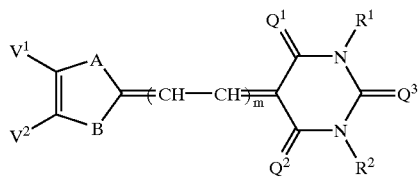

| Exemplary compound No. | A | B | $Q^1$ | $Q^2$ | $Q^3$ | $V^1$ | $V^2$ | $R^1$—$R^2$ | m |
|---|---|---|---|---|---|---|---|---|---|
| 27 | S | N—$^nC_8H_{17}$ | O | O | S | Cl | Cl | $C_2H_5$ | 0 |
| 28 | S | S | O | O | S | H | H | $C_2H_5$ | 0 |
| 29 | S | S | O | O | S | Cl | Cl | $^nC_4H_9$ | 0 |
| 30 | S | S | O | O | S | $CO_2CH_3$ | $CO_2CH_3$ | $C_2H_5$ | 0 |
| 31 | O | O | O | O | S | Cl | Cl | $C_2H_5$ | 0 |
| 32 | S | N—$C_2H_5$ | O | O | S | Cl | Cl | $C_2H_5$ | 1 |
| 33 | S | N—$^nC_4H_9$ | O | O | S | $CO_2C_2H_5$ | $CO_2C_2H_5$ | $^nC_4H_9$ | 1 |
| 34 | S | S | O | O | S | Cl | Cl | $^nC_4H_9$ | 1 |
| 35 | S | S | O | O | S | $CO_2CH_3$ | $CO_2CH_3$ | $C_2H_5$ | 1 |
| 36 | S | S | O | O | S | $CO_2C_2H_5$ | $CO_2C_2H_5$ | $^nC_4H_9$ | 1 |
| 37 | O | N—$C_2H_5$ | O | O | S | H | H | $C_2H_5$ | 1 |
| 38 | O | N—$^nC_4H_9$ | O | O | S | Cl | H | $C_2H_5$ | 1 |
| 39 | O | N—$^nC_4H_9$ | O | O | S | $SO_2CH_3$ | H | $C_2H_5$ | 1 |
| 40 | S | N—$^nC_8H_{17}$ | O | O | S | Cl | H | $C_2H_5$ | 2 |
| 41 | O | N—$C_2H_5$ | O | O | S | Cl | H | $C_2H_5$ | 2 |
| 42 | O | N—$C_2H_5$ | O | O | S | $SO_2CH_3$ | H | $C_2H_5$ | 2 |
| 43 | S | S | O | O | S | $SO_2CH_3$ | H | $C_2H_5$ | 2 |
| 44 | S | N—$C_2H_5$ | O | O | S | Cl | H | $C_2H_5$ | 3 |
| 45 | S | N—$C_2H_5$ | O | O | S | $SO_2CH_3$ | H | $C_2H_5$ | 3 |
| 46 | S | S | O | O | S | $SO_2CH_3$ | H | $C_2H_5$ | 3 |

Exemplary compound No.
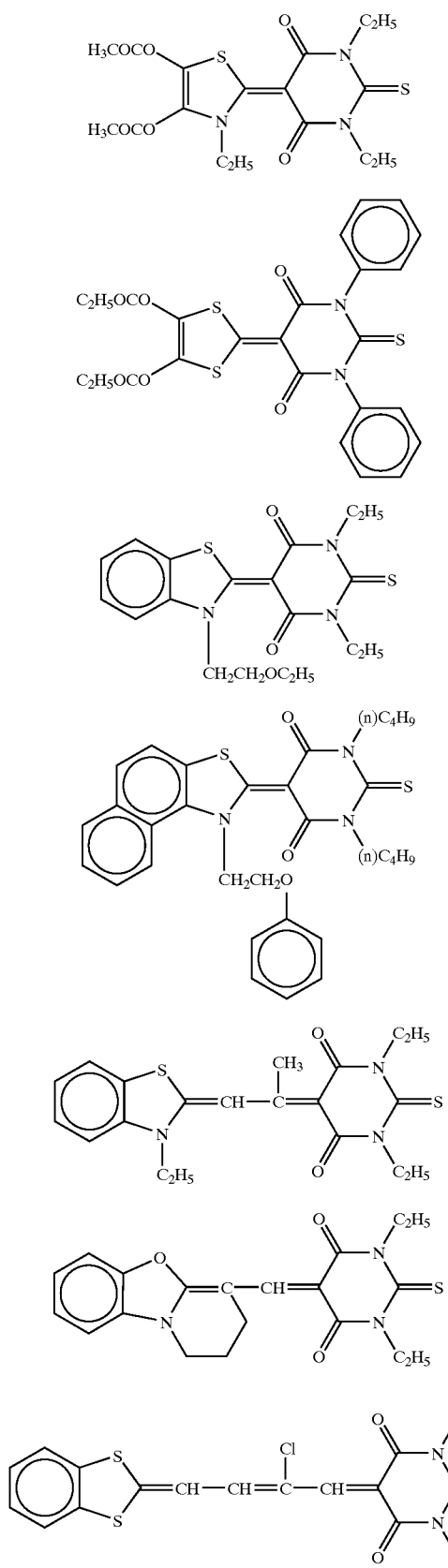
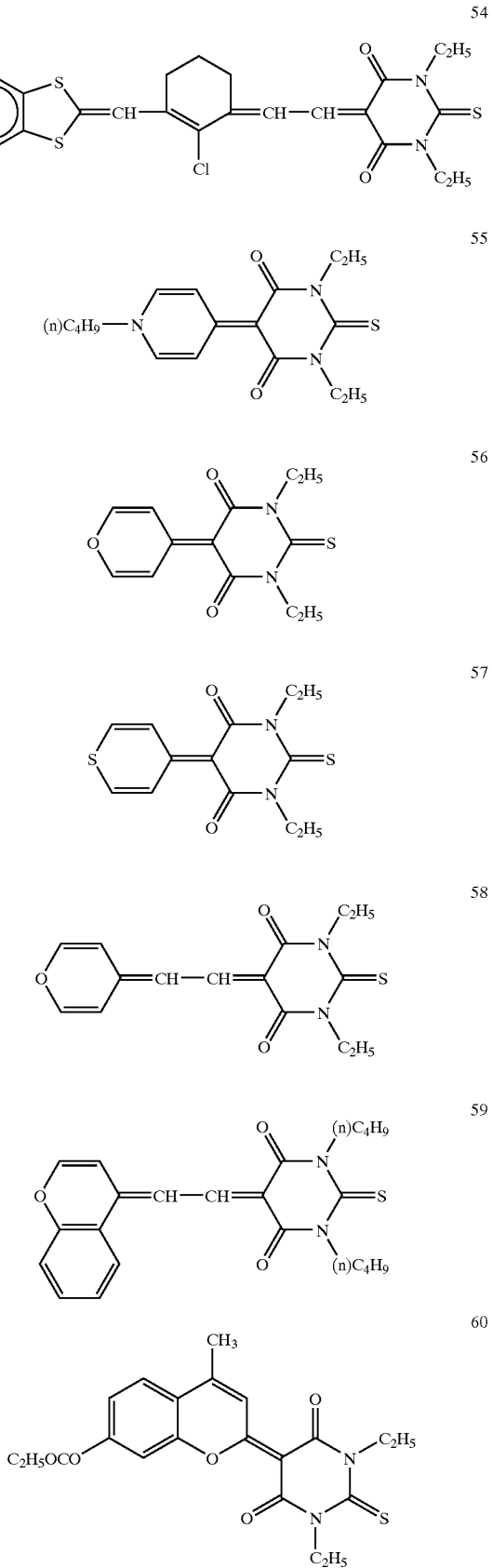

-continued

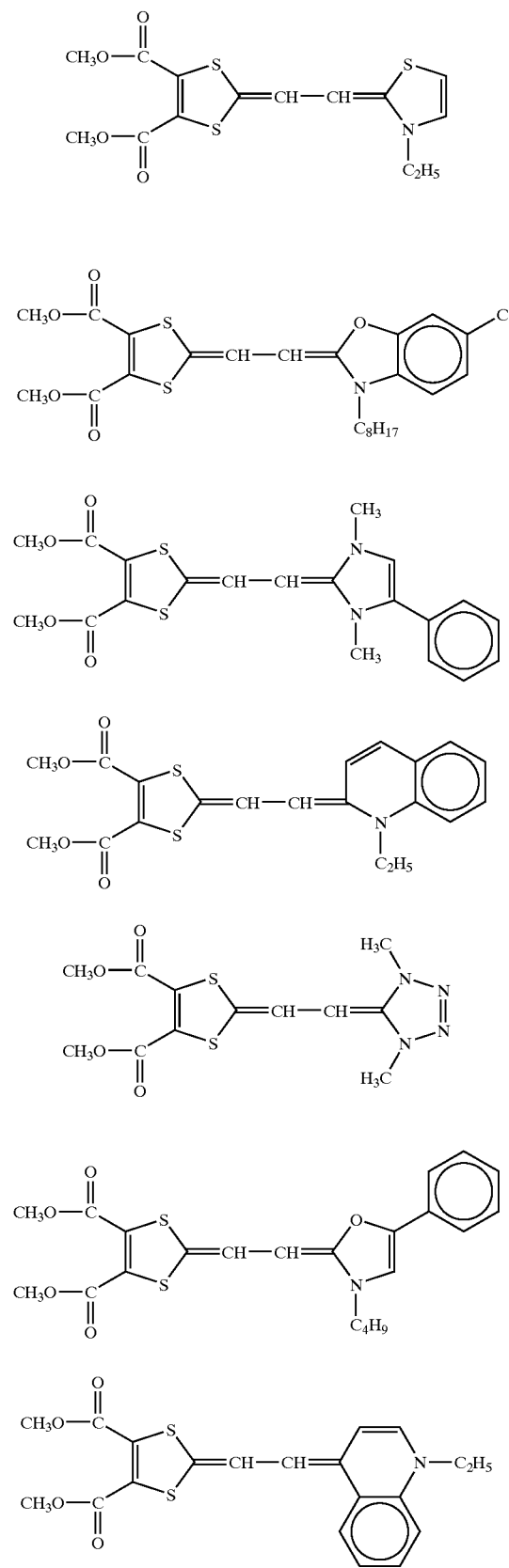
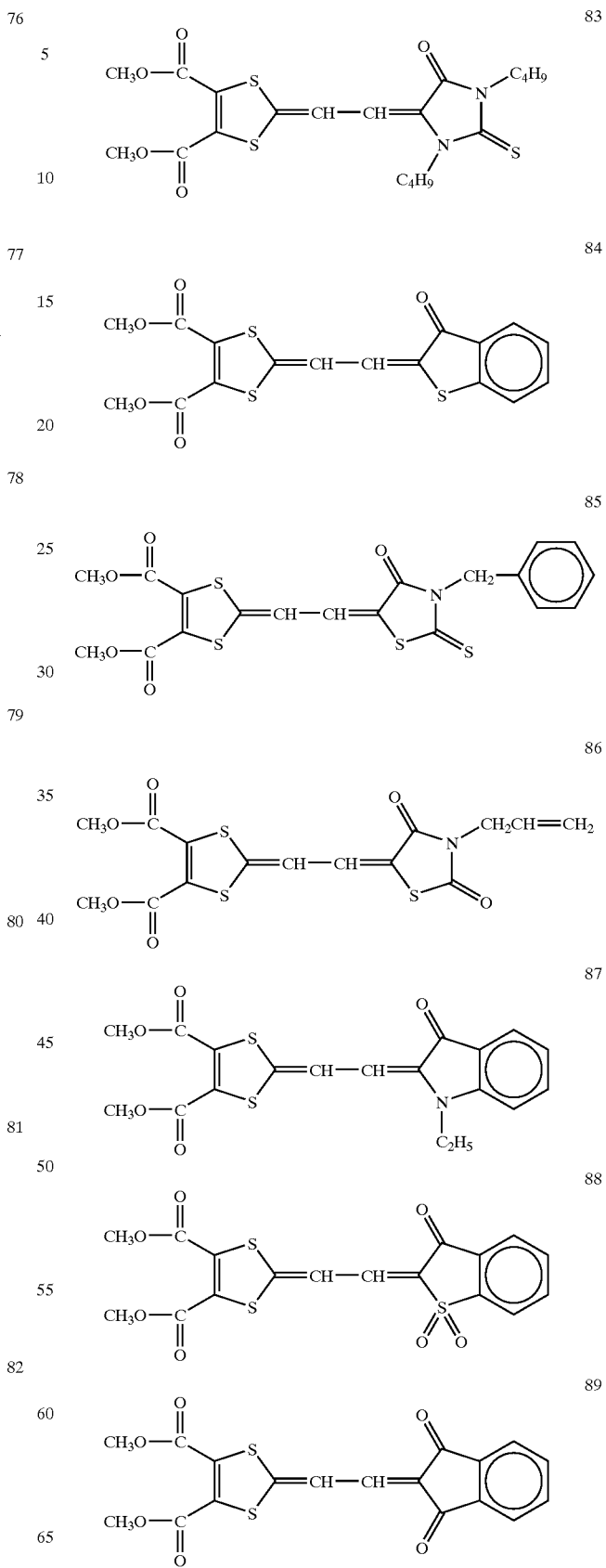

-continued

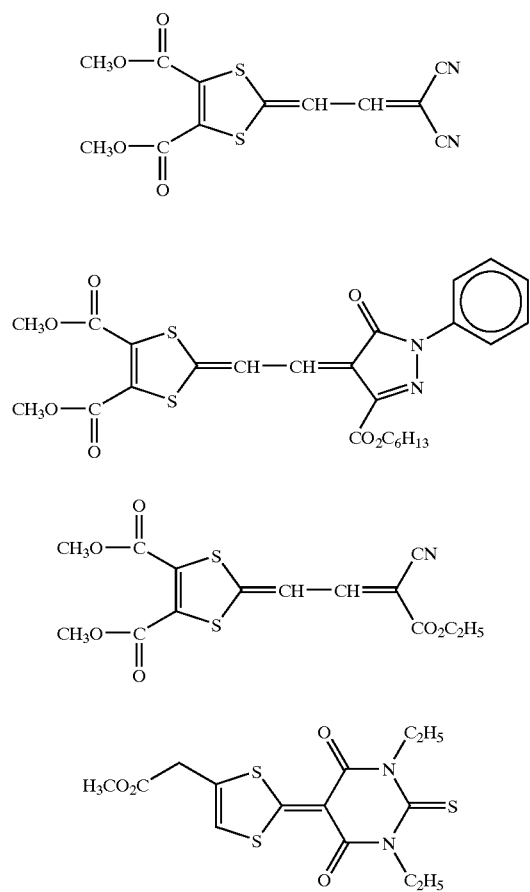

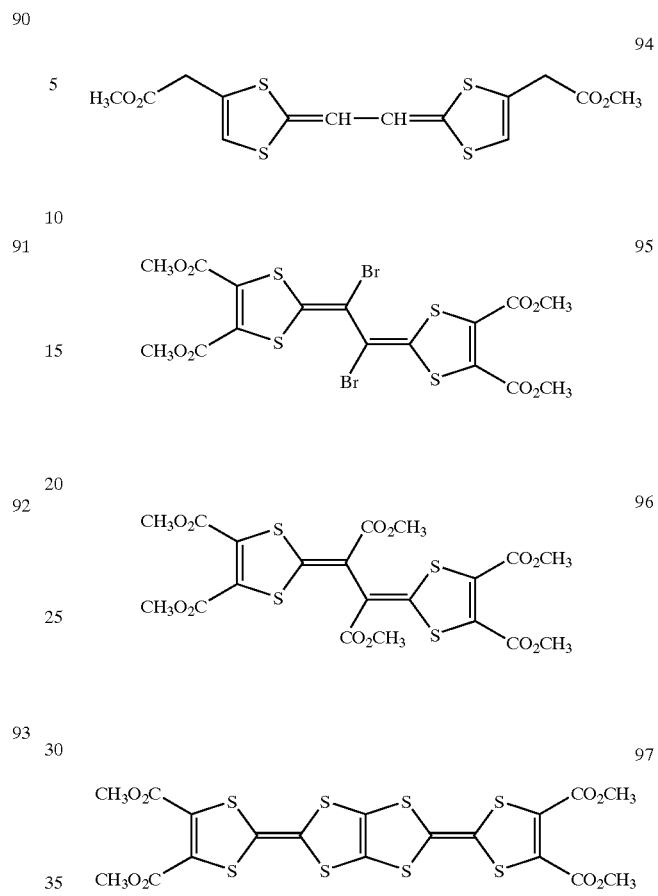

| Exemplary compound No. | $P^2$ | $R^4$ | $R^5$ | $R^6$ | $R^7$ | $R^8$ | $R^9$ | $R^{10}$ | $R^{11}$ |
|---|---|---|---|---|---|---|---|---|---|
| 98 | S | $CH_3$ | $CH_3$ | H | H | H | H | H | H |
| 99 | S | $^nC_4H_9$ | $^nC_4H_9$ | H | H | H | H | H | H |
| 100 | S | $^nC_4H_9$ | $^nC_4H_9$ | Cl | Cl | Cl | H | H | Cl |
| 101 | S | $^nC_4H_9$ | $^nC_4H_9$ | I | I | I | H | H | I |
| 102 | S | $^nC_4H_9$ | $^nC_4H_9$ | H | H | Ph | H | H | Ph |
| 103 | S | $C_2H_5$ | $C_2H_5$ | Cl | Cl | Ph | H | H | Ph |
| 104 | O | $C_2H_5$ | $C_2H_5$ | H | H | H | H | H | H |
| 105 | O | $C_2H_5$ | $C_2H_5$ | Cl | Cl | Cl | H | H | Cl |
| 106 | O | $^nC_4H_9$ | $^nC_4H_9$ | H | H | Ph | H | H | Ph |
| 107 | N—$^nC_4H_9$ | $^nC_4H_9$ | $^nC_4H_9$ | H | H | H | H | H | H |
| 108 | N—Ph | $^nC_4H_9$ | $^nC_4H_9$ | H | H | Cl | H | H | Cl |
| 109 | N—Ph | $^nC_4H_9$ | $^nC_4H_9$ | H | H | $C_2H_5OCO$ | H | H | $C_2H_5OCO$ |

Ph = 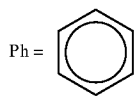

Exemplary compound No.

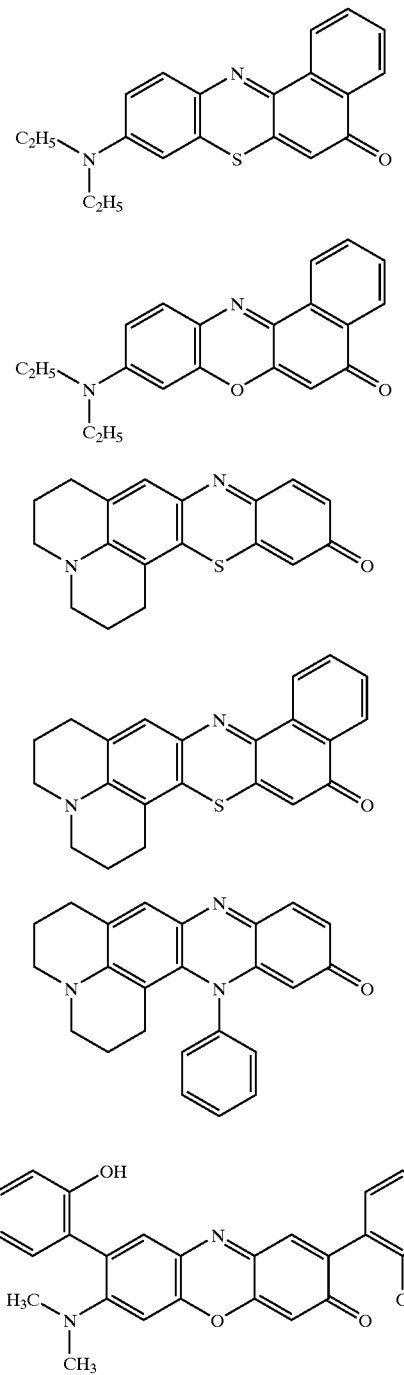

110
111
112
113
114
115

In the photopolymerizable compositions according to the first to third objects, each of the compounds represented by the general formulae (1) to (3) is incorporated preferably in an amount of 0.01 to 5% by weight, more preferably in an amount of 0.05 to 2% by weight, based on the weight of the radical generator which is described later.

(3) Organoboron Compounds or Radical Generators Represented by the General Formula (A)

In the photopolymerizable composition according to the first object, when the compound represented by the general formula (1), present in the vicinity of the organoboron compound represented by the general formula (A), absorbs light, the organoboron compound represented by the general formula (A) functions to interact with the compound represented by the general formula (1) to generate, in an efficient manner, a radical to thereby initiate the polymerization of the polymerizable compound present in the vicinity thereof.

General formula (A)

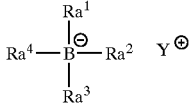

In the general formula (A), $R_a^1$, $R_a^2$, and $R_a^3$ each independently represents an aliphatic group, an aromatic group, a heterocyclic group, or —$SiR_a^5R_a^6R_a^7$; and $R_a^4$ represents an aliphatic group. When $R_a^1$ to $R_a^3$, and $R_a^4$ each represents an aliphatic group, examples of the aliphatic group include an alkyl group, a substituted alkyl group, an alkenyl group, a substituted alkenyl group, an alkynyl group, a substituted alkynyl group, an aralkyl group, and a substituted aralkyl group. Among these groups, an alkyl group, a substituted alkyl group, an alkenyl group, a substituted alkenyl group, an aralkyl group, and a substituted aralkyl group are preferable; and an alkyl group and a substituted alkyl group are particularly preferable. The aliphatic group may be an alicyclic group or a chain-like aliphatic group. The chain-like aliphatic group may be branched.

Examples of the alkyl group include a straight-chain alkyl group, a branched alkyl group, and a cyclic alkyl group. The number of carbon atoms in the alkyl group is preferably 1 to 30 and more preferably 1 to 20. The range of the preferable number of carbon atoms in the alkyl portion of the substituted alkyl group is the same as in the alkyl group. The alkyl group may be an alkyl group having a substituent or an alkyl group having no substituent.

Examples of the alkyl group include methyl, ethyl, propyl, butyl, pentyl, hexyl, cyclopentyl, neopentyl, isopropyl, isobutyl, cyclohexyl, octyl, 2-ethylhexyl, decyl, dodecyl, and octadecyl groups.

Specific examples of the substituent of the substituted alkyl group include the following groups: A carboxyl group, a sulfo group, a cyano group, a halogen atom (e.g., a fluorine, chlorine, or bromine atom), a hydroxyl group, an alkoxycarbonyl group having 30 or less carbon atoms (e.g., a methoxycarbonyl, ethoxycarbonyl, or benzyloxycarbonyl group), an alkylsulfonylaminocarbonyl group having 30 or less carbon atoms, an arylsulfonylaminocarbonyl group, an alkylsulfonyl group, an arylsulfonyl group, an acylaminosulfonyl group having 30 or less carbon atoms, an alkoxy group having 30 or less carbon atoms (e.g., a methoxy, ethoxy, benzyloxy, or phenethyloxy group), an alkylthio group having 30 or less carbon atoms (e.g., a methylthio, ethylthio, or methylthioethylthioethyl group), an aryloxy group having 30 or less carbon atoms (e.g., a phenoxy, p-tolyloxy, 1-naphthoxy, or 2-naphthoxy group), a nitro group, an alkyl group having 30 or less carbon atoms, an alkoxycarbonyloxy group, an aryloxycarbonyloxy group, an acyloxy group having 30 or less carbon atoms (e.g., an acetyloxy or propionyloxy group), an acyl group having 30 or less carbon atoms (e.g., an acetyl, propionyl, or benzoyl group), a carbamoyl group (e.g., a carbamoyl, N,N-dimethylcarbamoyl, morpholinocarbamoyl, or piperidinocarbamoyl group), a sulfamoyl group (e.g., a sulfamoyl, N,N-dimethylsulfamoyl, morpholinosulfamoyl, or piperidinosulfamoyl group), an aryl group having 30 or less carbon atoms (e.g., a phenyl, 4-chlorophenyl, 4-methylphenyl, or α-naphthyl group), a substituted amino group (e.g., an amino, alkylamino, dialkylamino, arylamino, diarylamino, or acylamino group), a substituted ureido group, a substituted phosphino group, a heterocyclic group, and so on. In the examples listed above, the carboxyl group, sulfo group, hydroxyl group, and phosphono group may be in the state of salts. In this case, examples of the cation constituting the salts include Y⁺ and the like which are described later.

Examples of the alkenyl group include a straight-chain alkenyl group, a branched alkenyl group, and a cyclic alkenyl group. The number of carbon atoms in the alkenyl group is preferably 2 to 30 and more preferably 2 to 20. The range of the preferable number of carbon atoms in the alkenyl portion of the substituted alkenyl group is the same as in the alkenyl group. The alkenyl group may be an alkenyl group having a substituent or an alkenyl group having no substituent.

Examples of the substituents of the substituted alkenyl groups include the same substituents as in the case of the substituted alkyl groups.

Examples of the alkynyl group include a straight-chain alkynyl group, a branched alkynyl group, and a cyclic alkynyl group. The number of carbon atoms in the alkynyl group is preferably 2 to 30 and more preferably 2 to 20. The range of the preferable number of carbon atoms in the alkynyl portion of the substituted alkynyl group is the same as in the alkynyl group. The alkynyl group may be an alkynyl group having a substituent or an alkynyl group having no substituent.

Examples of the substituents of the substituted alkynyl groups include the same substituents as in the case of the substituted alkyl groups.

Examples of the aralkyl group include a straight-chain aralkyl group, a branched aralkyl group, and a cyclic aralkyl group. The number of carbon atoms in the aralkyl group is preferably 7 to 35 and more preferably 7 to 25. The range of the preferable number of carbon atoms in the aralkyl portion of the substituted aralkyl group is the same as in the aralkyl group. The aralkyl group may be an aralkyl group having a substituent or an aralkyl group having no substituent.

Examples of the substituents of the substituted alkenyl groups include the same substituents as in the case of the substituted alkyl groups.

When $R_a^1$ to $R_a^3$ each represents an aromatic group, examples of the aromatic group include an aryl group and a substituted aryl group. The number of carbon atoms in the aryl group is preferably 6 to 30 and more preferably 6 to 20. The range of the preferable number of carbon atoms in the aryl portion of the substituted aryl group is the same as in the aryl group. Examples of the aryl group include a phenyl group, an α-naphthyl group, and a β-naphthyl group.

Examples of the substituents of the substituted aryl groups include the same substituents as in the case of the substituted alkyl groups.

When $R_a^1$ to $R_a^3$ each represents a heterocyclic group, examples of the heterocyclic ring group include a heterocyclic group having a substituent and a heterocyclic group having no substituent. Examples of the substituent of the heterocyclic group having a substituent include the same substituents as the substituents of $R_a^1$ to $Ra^3$ representing substituted aryl groups.

Among the heterocyclic groups represented by $R_a^1$ to $R_a^3$, preferable are heterocyclic groups containing a nitrogen atom, a sulfur atom, or an oxygen atom such as a furan ring, a pyrrole ring, an imidazole ring, an oxazole ring, a thiazole ring, or a pyridine ring.

When $R_a^1$ to $R_a^3$ each represents —SiR$_a^5$R$_a^6$R$_a^7$, R$_a^5$, R$_a^6$ and R$_a^7$ each independently represents an aliphatic group or an aromatic group. The aliphatic group and the aromatic group are the same as the aliphatic group represented by $R_a^1$ to $R_a^3$, and $R_a^4$ and the aromatic group represented by $R_a^1$ to $R_a^3$, respectively. The same holds true for the preferable examples thereof.

In the general formula (A), two or more of $R_a^1$, $R_a^2$, $R_a^3$ and $R_a^4$, may form a ring directly or via a substituent. In the case where a ring is formed, the ring is preferably any ring selected from the following (C1) to (C3) rings. Among these rings, (C2) is preferable.

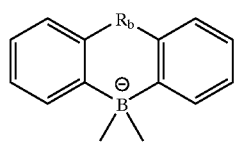

(C1)

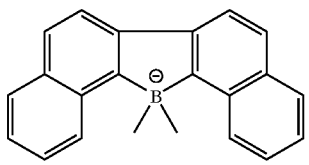

(C2)

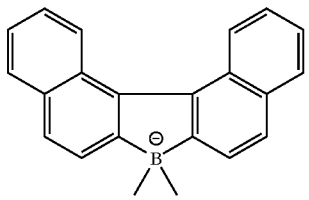

(C3)

In the ring (C1), $R_b$ represents any of the following bivalent groups.

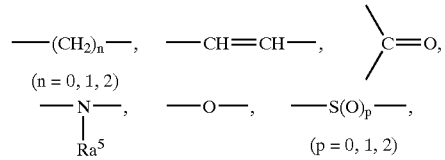

($R_a^5$ is H or a monovalent substituent)

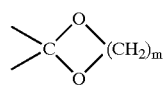

(m = 2, 3)

In the general formula (A), from the standpoint of high sensitivity and enhancement of storability, it is preferable that $R_a^1$ to $R_a^3$ are each an aryl group and $R_a^4$ is an alkyl group. In particular, a triarylalkyl-type organoboron compound, whose aryl group has an electron-withdrawing substituent, is preferable. Among these compounds, more preferable is a compound in which the sum of Hammett (σ) values of the substituents (electron-withdrawing groups) on the three aryl groups is +0.36~+2.58.

As the electron-withdrawing group, a halogen atom or a trifluoromethyl group is preferable, and a fluorine atom or a chlorine atom is particularly preferable.

Examples of the aryl group having an electron-withdrawing substituent include a 3-fluorophenyl group, a 4-fluorophenyl group, a 2-fluorophenyl group, a 3-chlorophenyl group, a 4-chlorophenyl group, 3-trifluoromethylphenyl group, 4-trifluoromethylphenyl group, 3,5-difluorophenyl group, 4-bromophenyl group, 3,4-difluorophenyl group, 5-fluoro-2-methylphenyl group, 5-fluoro-4-methylphenyl group, 5-chloro-2-methylphenyl group, 5-chloro-4-methylphenyl group, and so on.

Specific examples of the anionic portion of the general formula (A) include tetramethyl borate, tetraethyl borate, tetrabutyl borate, triisobutylmethyl borate, di-n-butyl-di-t-butyl borate, tetra-n-butyl borate, tri-m-chlorophenyl-n-hexyl borate, triphenylmethyl borate, triphenylethyl borate, triphenylpropyl borate, triphenyl-n-butyl borate, trimesityl-butyl borate, tritolylisopropyl borate, triphenylbenzyl borate, m-fluorotetrabenzyl borate, triphenylphenethylborate, triphenyl-p-chlorobenzylborate, triphenylethenylbutyl borate, di(α-naphthyl)-dipropyl borate, tri-n-butyl(dimethylphenylsilyl)borate, diphenyldihexyl borate, tri-m-fluorophenylhexyl borate, tri-(5-chloro-4-methylphenyl)hexyl borate, tri-m-fluorophenylcyclohexyl borate, tri-m-fluorophenylbenzyl borate, tri-(5-fluoro-2-methylphenyl)hexyl borate, and so on.

In the general formula (A), $Y^+$ represents a group capable of forming a cation. In particular, preferable are an organo-cationic compound, a complex cation coordinated with a transition metal (e.g., compounds described in U.S. Pat. No. 2,791,143), or a metallic cation (e.g., $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, $1/2Ca^{2+}$, and the like).

Examples of the organo-cationic compound include a quaternary ammonium cation, a quaternary pyridinium cation, a quaternary quinolinium cation, a phosphonium cation, an iodonium cation, a sulfonium cation, a dye cation, and so on.

Examples of the quaternary ammonium cation include a tetraalkyl ammonium cation (e.g., a tetramethylammonium cation or a tetrabutylammonium cation), and a tetraaryl ammonium cation (e.g., a tetraphenylammonium cation). Examples of the quaternary pyridinium cation include an N-alkylpyridinium cation (e.g., an N-methylpyridinium cation), an N-arylpyridinium cation (e.g., an N-phenylpyridinium cation), an N-alkoxypyridiniumcation (e.g., a 4-phenyl-N-methoxylpyridinium cation), and an N-benzoylpyridinium cation. Examples of the quaternary quinolinium cation include an N-alkylquinolinium cation (e.g., an N-methylquinolinium cation), and an N-arylqunolinium cation (e.g., an N-phenylquinolinium cation) Examples of the phosphonium cation include a tetraarylphosphonium cation (e.g., a tetraphenylphosphonium cation). Examples of the iodonium cation include a diaryliodonium cation (e.g., a dipenyliodonium cation). Examples of the sulfonium cation include a triarylsulfonium cation (e.g., a triphenylsulfonium cation).

In addition, specific examples of $Y^+$ described above include compounds described in JP-A No. 9-188686, paragraphs [0020] to [0381].

In the above-listed cationic compounds (exemplary compounds), the alkyl group is preferably an alkyl group having 1 to 30 carbon atoms such as an unsubstituted alkyl group, e.g., a methyl, ethyl, propyl, isopropyl, butyl, or hexyl group, or any one of the aforementioned alkyl groups represented by $R_a^1$ to $R_a^3$. Among these groups, an alkyl group having 1 to 12 carbon atoms is preferable.

In the above-listed cationic compounds, the aryl group is preferably, for example, a phenyl group, a halogen atom (e.g., chlorine atom)-substituted phenyl group, an alkyl (e.g., methyl)-substituted phenyl group, or an alkoxy (e.g., methoxy)-substituted phenyl group.

Specific examples of the organoboron compounds represented by the general formula (A) include the compounds described in U.S. Pat. Nos. 3,567,453 and 4,343,891, JP-A Nos. 62-143044, 62-150242, 9-188684, 9-188,685, 9-188686, Japanese Patent Application Publication (JP-B) No. 8-9643, No. 11-269210, and the following exemplary compounds (b-1 to 33). The organoboron compound may be used together with a radical generator that is described later. However, it should be noted that the organoboron compounds to be used in the present invention are not limited to these compounds.

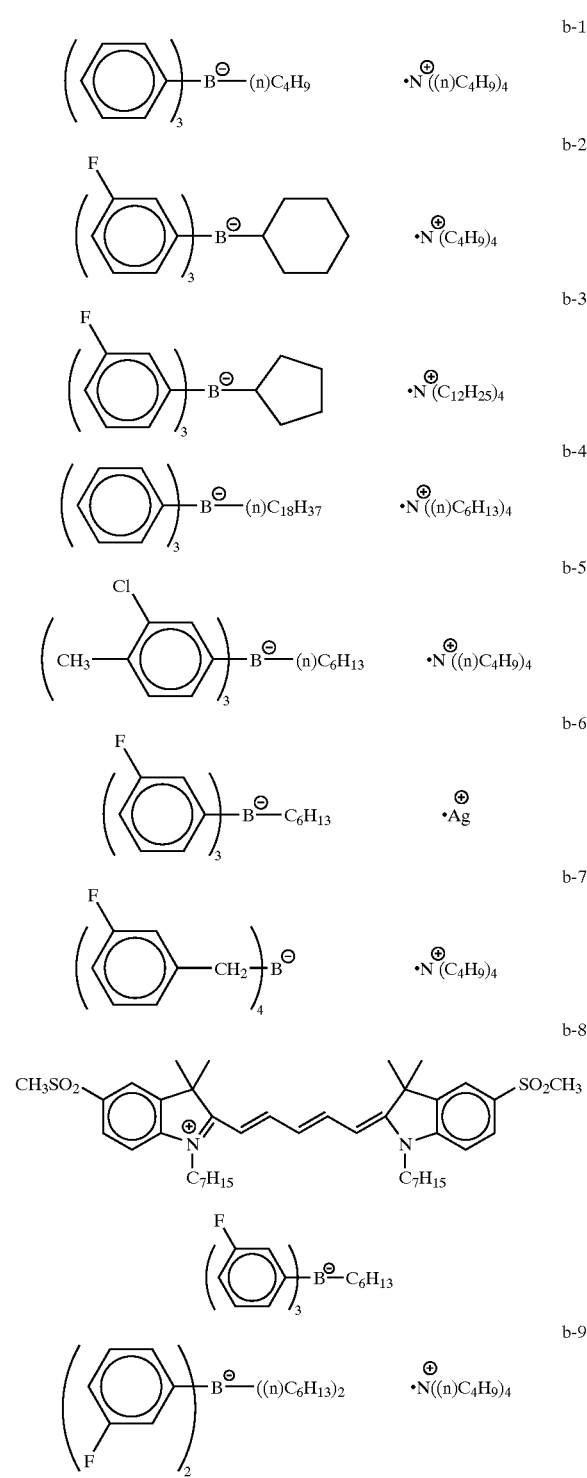

b-10 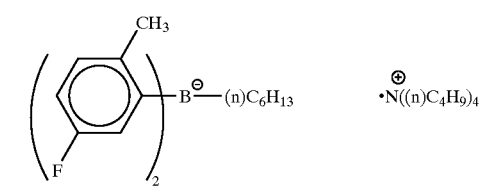
b-11 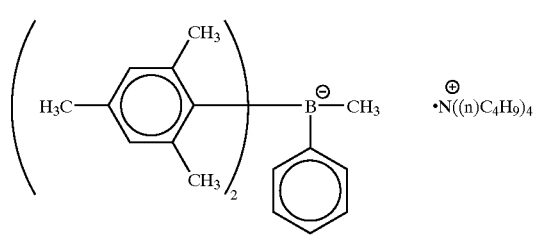
b-12 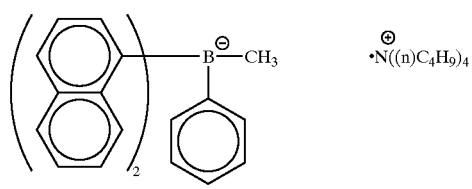
b-13 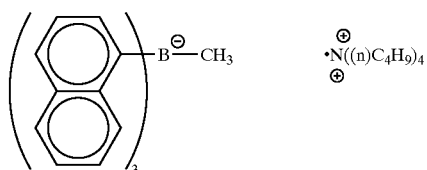
b-14 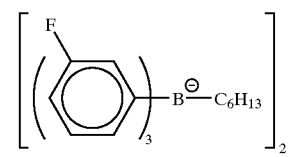
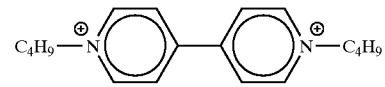
b-15 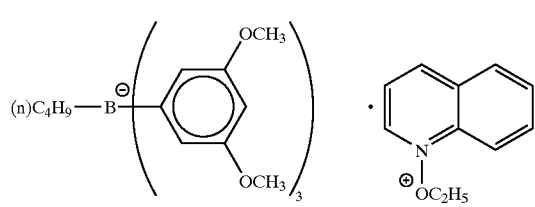
b-16 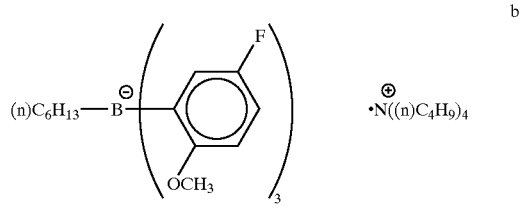
b-17 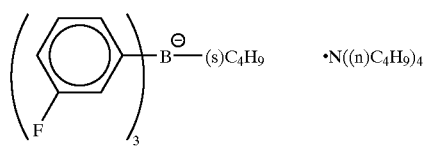
b-18 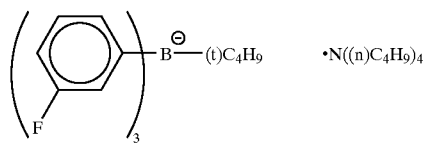
b-19 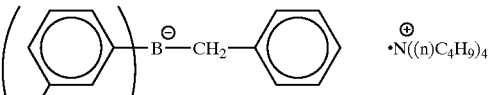
b-20 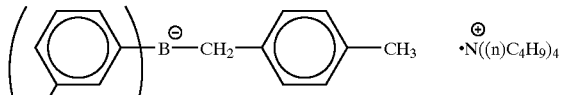
b-21 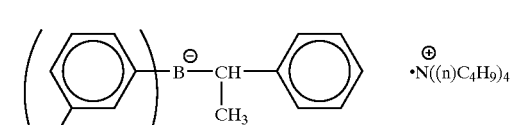
b-22 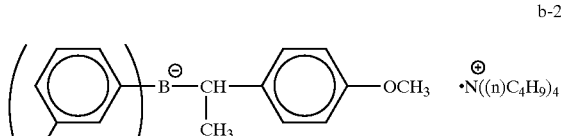
b-23 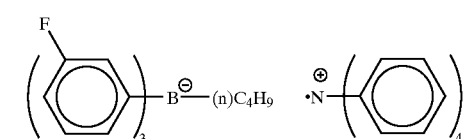
b-24 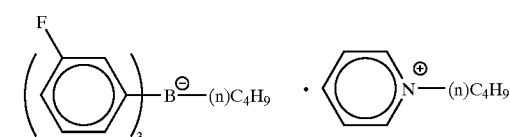
b-25 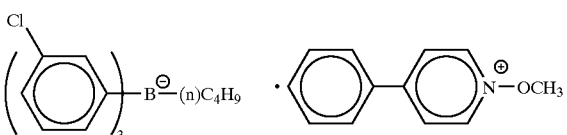
b-26 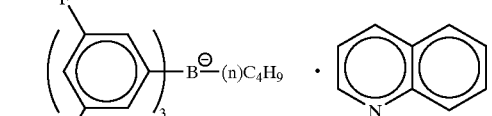
b-27 

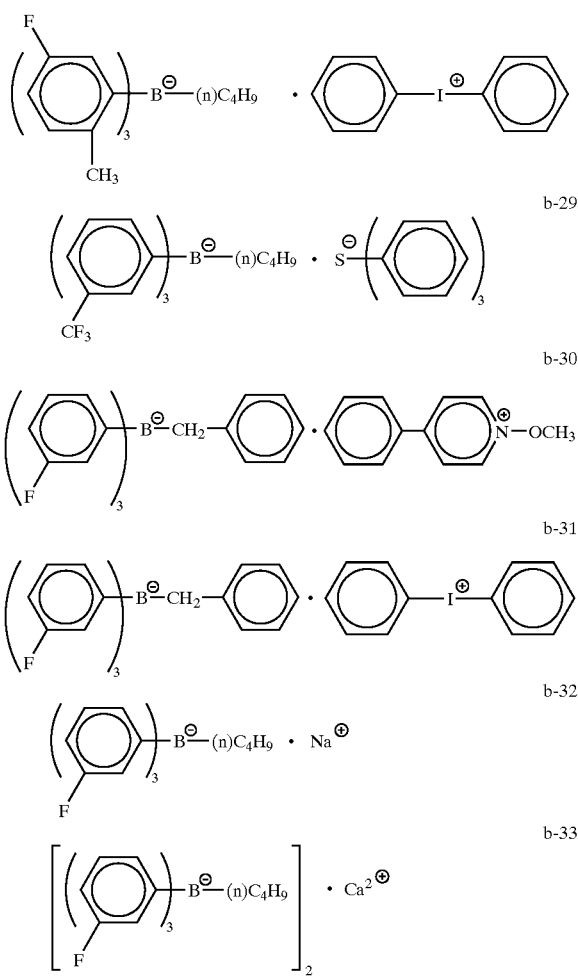

In the photopolymerizable composition according to the first object, the amount of the organoboron compounds represented by the general formula (A) is preferably 0.01 to 20% be weight, more preferably 0.1 to 10% by weight, based on the content of the polymerizable compound having an ethylenically unsaturated bond. However, the preferable range is not limited to the above-mentioned range because the preferable range varies depending on the kinds of the "polymerizable compound having an ethylenically unsaturated bond" to be used together.

The photopolymerizable compositions according to the second and third objects contain a compound (i.e., a radical generator) capable of interacting with the compound represented by the general formula (2) or (3) to generate a radical. When the compound represented by the general formula (2) or (3), present in the vicinity of the radical generator, absorbs light, the radical generator (A) functions to interact with the compound represented by the general formula (2) or (3) to generate a radical to thereby initiate the polymerization of the polymerizable compound present in the vicinity thereof. In the photopolymerizable compositions according to the second and third objects, it is preferable that the radical generator is the organoboron compound represented by the general formula (A) because, in that case, the radical can be generated in a highly efficient manner and the sensitivity is further enhanced. Besides, in the photopolymerizable compositions according to the second and third objects, when the organoboron compound represented by the general formula (A) is used as the radical generator, the preferable range of content is the same as that in the first object.

Examples of the radical generator include aromatic ketones such as benzophenone, camphor quinone, 4,4'-bis (dimethylamino)benzophenone, 4-methoxy-4'-dimethylaminobenzophenone, 4,4-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone, bisacylphosphine oxides, e.g., bis(2,4,6-trimethylbenzoyl)-phenylphosphine oxides, acylphosphine oxides, e.g., Lucirin TPO, α-hydroxy- or α-aminoacetophenones, α-hydroxycycloalkylphenylketones, and dialkoxyacetophenones; benzoin and benzoin ethers such as benzoin methyl ether, benzoin ethyl ether, benzoin isopropyl ether, and benzoin phenyl ether; dimers of 2,4,6-triarylimidazole, such as a dimer of 2-(o-chlorophenyl)-4,5-diphenylimidazole, a dimer of 2-(o-chlorophenyl)-4,5-di(m-methoxyphenyl) imidazole, a dimer of 2-(o-fluorophenyl)-4,5-diphenylimidazole, a dimer of 2-(o-methoxyphenyl)-4,5-diphenylimidazole, and a dimer of 2-(p-methoxyphenyl)-4,5-diphenylimidazole, and compounds described in, for example, U.S. Pat. Nos. 3,784,557, 4,252,887, 4,311,783, 4,459,349, 4,410,621, and 4,622,286; polyhalogen compounds such as carbon tetrabromide, phenyltribromomethylsulfone, and phenytrichloromethyl ketone; compounds described in JP-A No. 59-133428, JP-B No. 57-1819, JP-B No. 57-6096, and U.S. Pat. No. 3,615, 455; S-triazine derivatives having a trihalogen-substituted methyl group described in JP-A No. 58-29803 such as 2,4,6-tris(trichloromethyl)-S-triazine, 2-methoxy-4,6-bis (trichloromethyl)-S-triazine, 2-amino-4,6-bis (trichloromethyl)-S-triazine, and 2-(p-methoxystyryl)-4,6-bis(trichloromethyl)-S-triazine; organic peroxides described in JP-A No. 59-189340 such as methyl ethyl ketone peroxide, cyclohexanone peroxide, 3,3,5-trimethylcyclohexanone peroxide, benzoyl peroxide, ditertiarybutyl diperoxyisophthalate, 2,5-dimethyl-2,5-di (benzoylperoxy)hexane, tertiarybutyl peroxybenzoate, a,a'-bis(tertiarybutylperoxyisopropyl)benzene, and dicumylperoxide, 3,3',4,4'-tetra-(tertiarybutylperoxy-carbonyl)benzophenone; azinium salts described in U.S. Pat. No. 4,743,530; aforementioned organoboron compounds; phenyglyoxalates such as methyl phenyglyoxalate; titanocenes such as bis($\eta^5$-2,4-cyclopentadiene-1-yl)-bis(2, 6-difluoro-3-(1H-pyrrole-1-yl)-phenyl)titanium; iron allene complexes such as $\eta^5$-cyclopentadienyl-$\eta^6$-cumenyl-iron (1+)-hexafluorophosphate(1−); diaryl iodonium salts such as a diphenyl iodonium salt; and triaryl sulfonium salts such as a triphenyl sulfonium salt.

More specific examples of the radical generators described above and examples of other kinds of radical generators include compounds described in JP-A No. 10-45816, paragraphs [0067] to [0132].

In addition, a material made up of a combination of two or more compounds can be used as the radical generator described above. Examples of the combination include a combination of a dimer of 2,4,5-triarylimidazole and mercaptobenzoxazole or the like, a combination of 4,4'-bis (dimethylamino)benzophenone, benzophenone, and benzoin methyl ether described in U.S. Pat. No. 4,427,161, a combination of benzoyl-N-methylnaphtothiazoline and 2,4-bis (trichloromethyl)-6-(4'-methoxyphenyl)-triazole described in U.S. Pat. No. 4,239,850, a combination of a dialkylaminobenzoate ester and dimethylthioxanthone described in JP-A No. 57-23602, a combination made up of 3 kinds of compounds, i.e., 4,4'-bis(dimethylamino)benzophenone, benzophenone, and a polyhalogenated-methyl compound described in JP-A No. 59-78339.

When the radical generator is made up of two or more kinds of compounds, it is preferable to use the combination of 4,4'-bis(diethylamino)benzophenone and benzophenone, the combination of 2,4-diethylthioxanthone and ethyl 4-dimethylaminobenzoate, or the combination of 4,4'-bis(diethylamino)benzophenone and a dimer of 2,4,5-triarylimidazole.

Among the above-listed radical generators, from the standpoint of the capability to interact with the dye in a range of light for exposure to thereby generate a radical effectively and to raise the sensitivity, preferable is an organoboron compound, a diaryl iodonium salt, an iron allene complex, an S-triazine derivative having a trihalogen-substituted methyl group, an organic peroxide, titanocene, a dimer of 2,4,5-triarylimidazole, or an azinium salt compound, and particularly preferable is the organoboron compound. The organoboron compound is preferable because, even when a spectrally sensitizing dye is used as a spectrally sensitizing compound, the organoboron compound can satisfactorily decolorize the spectrally sensitizing dye present when images are fixed by irradiation with light. The organoboron compound may be used together with the radical generator.

Examples of the organoboron compounds include the compound represented by the general formula (A) as well as the organoboron compound which is based on a spectrally sensitizing dye and whose structure comprises, as the cationic portion thereof, a cationic dye described in, for example, "Chemistry of Functional Dyes" (Kinoosei Shikiso no Kagaku), CMC Publishing Co., Ltd., 1981, pp.393–416 and "Coloring Materials" (Shikizai) (60 [4], 212–224 (1987). Examples of the above-mentioned organoboron compound that is based on a spectrally sensitizing dye include compounds described in, for example, JP-A Nos. 62-143044 and 1-138204, PCT National Publication No. 6-505287, and JP-A Nos. 4-261406.

Cationic dyes having a maximum absorption wavelength in a wavelength region of 300 nm or greater, preferably in a wavelength region of 400 to 1100 nm, can be used as the dyes constituting the cationic portion of the above-mentioned organoboron compound that is based on a spectrally sensitizing dye. Among these dyes, preferable are cationic methine dyes, polymethine dyes, triarylmethane dyes, indoline dyes, azine dyes, xanthene dyes, cyanine dyes, hemicyanine dyes, rhodamine dyes, azomethine dyes, oxazine dyes, acridine dyes, and the like. More preferable are cationic cyanine dyes, hemicyanine dyes, rhodamine dyes, and azomethine dyes.

In the photopolymerizable composition according to the second object, the amount of the radical generator is the same as in the photopolymerizable composition according to the first object. However, the preferable range is not limited to the above-mentioned range because the preferable range varies depending on the kinds of the "polymerizable compound having an ethylenically unsaturated bond" to be used together.

(4) Other Components

According to the purposes, the photopolymerizable composition of the present invention may contain conventionally known additives appropriately selected as other components in so far as these additives do not impair the effects.

Examples of the other components include a photopolymerization initiator, an oxygen-eliminating agent, a thermal polymerization inhibitor, an ultraviolet absorber, a fluorescent brightener, a chain-transfer agent, an antioxidant, and precursors thereof. The amounts of these additives are preferably 0.01 to 20% by weight, more preferably 0.2 to 15% by weight, and particularly preferably 0.5 to 10% by weight based on the total weight of the photopolymerizable composition.

Specific examples of the additives such as chain-transfer agents and antioxidants include those described in, for example, JP-A No. 10-45816, paragraphs [0135]–[0141], JP-A No. 9-188686, paragraphs [0087]–[0096], JP-A No. 10-182621, paragraphs [0079]–[0118], and JP-A No. 9-95487, paragraphs [0080]–[0089]. In addition, specific examples of the additives include the compounds described in, for example, JP-A Nos. 1-13140, 1-13141, 1-13143, 1-13144, 1-17048, 1-229003, 1-298348, 10-138638, 11-269210, and 2-187762.

The photopolymerizable composition of the present invention may contain a binder, too. In particular, the use of the binder is advantageous when the photopolymerizable composition is a liquid or viscous substance.

The content of the binder is preferably 5 to 95% by weight, more preferably 10 to 90% by weight, and particularly preferably 15 to 85% by weight based on the total weight of solid components.

The selection of the binder is made depending on the fields of application and characteristics, such as capability to develop images in a water- or organic solvent-based system, adhesion to supports, and sensitivity to oxygen, required for the fields of application.

A polymer having a molecular weight of about 5,000 to 2,000,000, preferably 10,000 to 1,000,000, is desirable as the binder. Examples of the polymer include homopolymers or copolymers of acrylates and methacrylates (e.g., a copolymer of methyl methacrylate/ethyl acrylate/methacrylic acid, a poly(alkyl methacrylate), and a poly(alkyl acrylate)), cellulose esters or cellulose ethers (e.g., cellulose acetate, cellulose acetobutylate, methyl cellulose, and ethyl cellulose), polyvinyl butyral, polyvinyl formal, cyclized rubber, polyethers (e.g., polyethylene oxide, polypropylene oxide, and polytetrahydrofuran), polystyrene, polycarbonate, polyurethane, chlorinated polyolefin, polyvinyl chloride, vinyl chloride/vinylidene copolymers, vinylidene chloride/acrylonitrile copolymers, methyl methacrylate, vinyl acetate, polyvinyl acetate, copoly (ethylene/vinyl acetate), polycaprolactam, poly (hexamethylene adipamide), polyesters (e.g., poly(ethylene glycol terephthalate) and poly(hexamethylene glycol succinate)), polyamide, polyurea, and so on.

Further examples include water-soluble polymers such as gelatins, (modified)polyvinyl alcohol, polyvinylpyrrolidone, hydrolysis products of styrene/maleic acid copolymers, sodium polystyenesulfonate, and sodium alginate. Furthermore, latices such as styrene/butadiene rubber latex, acrylonitrile/butadiene rubber latex, and methyl acrylate/butadiene rubber latex may be used.

An unsaturated compound can also be used as a mixture with a non-photopolymerizable, film-forming component. An example of the unsaturated compound is a physically dried polymer or a polymer solution of an organic solvent such as nitrocellulose or cellulose acetobutylate. The compound may be a chemically and/or thermally hardenable (i.e., thermosetting) resin such as polyisocyanate, polyepoxide, a melamine resin, or a polyimide precursor. The use of a thermosetting resin in the photopolymerizable composition is important for a system known as a hybrid system in which the composition undergoes photopolymerization at the first stage and thereafter crosslinking by a thermal post-treatment at the second stage.

In addition, a binder having a polymerizable group can also be used.

Examples of other additives include the additives described in JP-A No. 11-269210.

A light source that is usable when image-wise exposure is carried out can be selected appropriately from known light sources whose emission wavelengths range from visible to infrared regions. Among the light sources, preferable is a light source whose maximum absorption wavelength is 300 to 1000 nm and more preferable is a (semiconductor) laser source or an LED of blue, green, or red in view of simple and small-sized apparatus and low costs. Besides, in order to obtain a higher sensitivity, it is preferable to select a light source whose wavelength matches the absorption wavelength of the light-absorbing material such as a spectrally sensitizing dye or the like.

On the other hand, it is preferable that the light source that is usable for the decolorization of the photopolymerizable composition and the recording material described later is selected from light sources whose wavelengths match the absorption wavelength of the photopolymerizable composition. Specific examples of the light sources suited for this purpose are wide-ranging and include a mercury lamp, an ultrahigh-pressure mercury lamp, an electrodeless discharge type mercury lamp, a xenon lamp, a tungsten lamp, a metal halide lamp, a (semiconductor) laser light source, an LED, a fluorescent lamp.

As described above, the use of the compounds represented by the general formulae (1) to (3) [including the general formulae (1a) and (1b)] as spectrally sensitizing dyes makes it possible to form images with a high-level of sensitivity not only using ultraviolet light but also using visible to infrared light and to obtain images without remnant colors due to the dye components because the compounds themselves have excellent decolorization properties.

<Recording Material>

The recording material of the present invention comprises a support having disposed thereon a recording layer containing at least a color-forming component A, a color-forming component B having a site which reacts with the color-forming component A and causes the color-forming component A to develop a color, and the photopolymerizable composition of the present invention described above. In addition, if necessary, the recording material of the present invention may have other layers such as a primer layer, an intermediate layer, a light-absorbing layer, a protective layer, and a back coat layer.

The basic aspect of the recording material of the present invention is not particularly limited and the recording material of the present invention may be constructed according to the purposes.

As an example of the basic object, the image formation, in which the recording material of the present invention is applied to a positive-type photo- and heat-sensitive recording material having the color-forming component A enclosed in heat-responsive microcapsules, is described below.

That is, according to the positive-type recording material, when it is irradiated with light image-wise, a radical is generated from the radical generator contained in the irradiated region of the photopolymerizable composition and the radical thus generated initiates the polymerization reaction of the polymerizable compound and hardens the polymerizable compound. As a result, the polymerizable composition is fixed on the site and a latent image is formed. The microcapsules are impermeable to substances at room temperature and therefore the color-forming component A enclosed in the microcapsules is out of contact with the color-forming component B having in the molecule thereof a site which reacts with the color-forming component A to thereby cause the color-forming component A to develop a color. Accordingly, the microcapsules are in a state that does not develop color at room temperature.

At a later stage when heat is applied to the entire surface of the photo- and heat-sensitive recording material, the microcapsules are made permeable to substances and therefore the color-forming component B in a non-irradiated region penetrates into the microcapsules (and/or the color-forming component A is released out of the microcapsules) to react with the color-forming component A and color is developed only in the non-irradiated region. On the other hand, in the irradiated region, since the photopolymerizable composition is in a hardened and fixed state due to the polymerization reaction, the color-forming components A and B are immobilized and out of contact with each other and therefore color is not developed in the irradiated region. After that, when the entire surface of the photo- and heat-sensitive recording material is exposed to light, the region that has not been polymerized undergoes polymerization (i.e., fixation) and the dye component contained in the photopolymerizable composition can be decolorized.

Alternatively, the recording material of the present invention may be a recording material according to the following object (i.e., the first or the second object) and the image forming method may be selected according to each object.

That is, in the recording material according to the first object, at least one of the polymerizable compounds contained in the polymerizable composition is the color-forming component B itself and the recording layer comprises at least the color-forming component A and the photopolymerizable composition of the present invention which contains the color-forming component B capable of causing the color-forming component A to develop a color. If the recording material is applied to a positive-type photo- and heat-sensitive recording material of the above-described basic object, the color-forming component B has a site which causes the color-forming component A to develop a color and an ethylenically unsaturated bond as stated above. When the recording material is irradiated with light image-wise, the color-forming component B initiates the polymerization reaction and hardens. As a result, the color-forming component B is fixed on the site and a latent image is formed. Therefore, in the irradiated region, the color-forming component B is immobilized on the site and is out of contact with the color-forming component A. Accordingly, the color-forming component B does not develop color in the irradiated region.

In the recording material according to the second object of the present invention, the recording layer thereof contains at least a color-forming component A, a color-forming component B which reacts with the color-forming component A and causes the color-forming component A to develop a color, and the photopolymerizable composition of the present invention described above, wherein the polymerizable compound, which is contained in the photopolymerizable composition and has an ethylenically unsaturated bond (i.e., a polymerizable compound), is a color formation inhibiting compound having in the molecule thereof a site which inhibits the reaction between the color-forming component A and the color-forming component B (i.e., a reaction inhibiting site).

As an example of image formation, in which the recording material of the present invention is applied to a negative-type photo- and heat-sensitive recording material having the color-forming component A enclosed in heat-responsive microcapsules, is described below.

In the negative-type photo- and heat-sensitive recording material according to this object, the microcapsules are impermeable to substances at room temperature and therefore the color-forming component A is out of contact with the color-forming component B. Accordingly, color is not developed at room temperature. When the recording material is irradiated with light image-wise, the polymerizable compound in the irradiated region initiates the polymerization reaction and hardens. As a result, the polymerizable composition is fixed on the site and a latent image is formed. After that, when heat is applied to the entire surface of the photo- and heat-sensitive recording material, the microcapsules become permeable to substance and therefore the color-forming component B penetrates into the microcapsules (and/or the color-forming component A is released from the microcapsules). At the same time, in the non-irradiated region, the polymerizable compound, also acting as a color formation inhibiting compound, penetrates into the microcapsules and the color developing reaction between the color-forming components A and B is inhibited. As a result, the non-irradiated region is maintained in a non-colored state. On the other hand, in the irradiated region, since the photopolymerizable compound (i.e., a color formation inhibiting compound) is fixed to the site by the polymerization reaction, the photopolymerizable compound is not involved in the reaction between the color-forming components A and B, while the color developing reaction proceeds. In this way, color is developed only in the irradiated region. After that, when the entire surface of the photo- and heat-sensitive recording material is exposed to light, the dye component contained in the photopolymerizable composition can be decolorized.

The same light sources as those usable in the exposure of the photopolymerizable composition of the present invention can be used as the light sources for the image formation by the recording material of the present invention.

The constituent components to be used in the recording material of the present invention are explained below.

(Photopolymerizable Composition)

The photopolymerizable composition comprises (1) a polymerizable compound having an ethylenically unsaturated bond (i.e., a polymerizable compound), (2) an organic dye that can be decolorized (i.e., a spectrally sensitizing dye), (3) a radical generator capable of interacting with the dye to generate a radical, and optionally (4) other components. In the recording material of the present invention, the photopolymerizable composition of the present invention described above is used. That is, the recording material of the present invention according to the first object and the recording material of the present invention according to the second object comprise the photopolymerizable composition according to the first object or the photopolymerizable composition according to the second object, respectively.

When the photopolymerizable compositions is irradiated with light, the spectrally sensitizing dye absorbs the light and interacts with the radical generator to generate a radical. The radical thus generated causes the radical polymerization of the polymerizable compound to thereby harden the polymerizable compound and form images.

The details of the polymerizable compound are as described previously. Several kinds of the polymerizable compounds may be incorporated in the photopolymerizable composition. As in the recording material according to the first object, at least one of the polymerizable compounds may be the color-forming component B having a site capable of causing the color-forming component A to develop a color, and a color-forming component having in the molecule thereof an ethylenically unsaturated bond (i.e., a polymerizable group) is used as described later.

On the other hand, as in the recording material according to the second object, the polymerizable compound may function also as a color-formation inhibiting compound, and a polymerizable compound having in the molecule thereof a site, which inhibits the color developing reaction between the color-forming components A and B, is used.

These polymerizable compounds are described later together with the color-forming components (A and B) to be incorporated in the recording layer.

The content of the photopolymerizable composition in the recording layer is preferably 0.1 to 50 $g/m^2$, and more preferably 1 to 30 $g/m^2$.

(Color-forming Components)

In the recording material of the present invention, the recording layer contains the color-forming component A and color-forming component B as a color-forming source together with the photopolymerizable composition. In the case of the recording material according to the first object, the recording material contains the color-forming component A together with the photopolymerizable composition, wherein the color-forming component B as a polymerizable compound contained in the photopolymerizable composition reacts with the color-forming component A to thereby develop a color.

Examples of the combination of the color-forming component A and the color-forming component B as a color-forming source constituting image portions include the following combinations (a) to (s). In the following combinations, the color-forming component A is listed first and followed by the color-forming component B.

(a) a combination of an electron-donating dye precursor and an electron-accepting compound;

(b) a combination of a diazo compound and a coupling component (hereinafter referred to as "a coupler compound" upon occasion);

(c) a combination of a metal salt of an organic acid, such as silver behenate or silver stearate, and a reducing agent such as protocatechinic acid, spiroindan, or hydroquinone;

(d) a combination of an iron salt of a long-chain fatty acid, such as ferric stearate or ferric myristate, and a phenol such as tannic acid, gallic acid, or ammonium salicylate;

(e) a combination of a heavy metal salt of an organic acid, such as a nickel, cobalt, lead, copper, iron, mercury, or silver salt of acetic acid, stearic acid, or palmitic acid, and a sulfide of an alkali metal or an alkaline earth metal, such as calcium sulfide, strontium sulfide, or potassium sulfide, or a combination of the above-described heavy metal salt of an organic acid and an organic chelating agent such as s-diphenylcarbazide or diphenylcarbazone;

(f) a combination of a heavy metal sulfate, such as a silver, lead, mercury, or sodium salt of sulfuric acid, and a sulfur compound such as sodium tetrathionate, sodium thiosulfate, or thiourea;

(g) a combination of a ferric salt of a fatty acid, such as ferric stearate, and an aromatic polyhydroxy compound such as 3,4-hydroxytetraphenyl methane;

(h) a combination of a metal salt of an organic acid, such as silver oxalate or mercury oxalate, and an organic polyhydroxy compound such as polyhydroxy alcohol, glycerin, or glycol;

(i) a combination of a ferric salt of a fatty acid, such as ferric pelargonate or ferric laurate, and a thiocesylcarbamide or isothiocesylcarbamide derivative;

(j) a combination of a lead salt of an organic acid, such as lead capronate, lead pelargonate, or lead behenate, and a thiourea derivative such as ethylene thiourea or N-dodecyl thiourea;

(k) a combination of a heavy metal salt of a higher fatty acid, such as ferric stearate or copper stearate, and zinc dialkyldithiocarbamate;

(l) a combination capable of forming an oxazine dye such as a combination of resorcinol and a nitroso compound;

(m) a combination of a formazan compound and a reducing agent and/or a metal salt;

(n) a combination of a protected dye (or a leuco dye) precursor and a protector-removing agent;

(o) a combination of an oxidation-type color-forming agent and an oxidizing agent;

(p) a combination of a phthalonitrile and a diiminoisoindoline (i.e., a combination that forms phthalocyanine);

(q) a combination of an isocyanate and a diiminoisoindoline (i.e., a combination that forms a coloring pigment);

(r) a combination of a pigment precursor and an acid or base (i.e., a combination that forms a pigment);

(s) a combination of a precursor as the oxidized form of a p-phenylene diamine or p-aminophenol derivative and a coupling component (i.e., a coupler compound).

Among the above-listed two-component combinations, preferable are (a) a combination of an electron-donating dye precursor and an electron-accepting compound; (b) a combination of a diazo compound and a coupling component (hereinafter referred to as "a coupler compound" upon occasion); (n) a combination of a protected dye (or a leuco dye) precursor and a protector-removing agent; and (s) a combination of a precursor as the oxidized form of a p-phenylene diamine or p-aminophenol derivative and a coupling component (i.e., a coupler compound). That is, an electron-donating dye precursor, a diazo compound, a dye precursor, or a precursor in the oxidized form is preferable as the color-forming component A, while an electron-accepting compound, a coupler compound, or a protector-removing agent is preferable as the color-forming component B.

When an electron-donating, colorless dye precursor is used as the color-forming component A, examples of the electron-donating, colorless dye precursor include a phthalide-based compound, a fluoran-based compound, a phenothiazine-based compound, an indolylphthalide-based compound, a leucoauramine-based compound, a rhodamine lactam-based compound, a triphenylmethane-based compound, a triazene-based compound, a spriopyran-based compound, a pyridine-based compound, a pyrazine-based compound, a fluorene-based compound, and so on, all known in heat-sensitive paper, pressure-sensitive paper, and the like.

Examples of the phthalide-based compound include the compounds described in, for example, re-issued U.S. Pat. No. 23,024, and U.S. Pat. Nos. 3,491,111, 3,491,112, 3,491,116, and 3,509,174. Specific examples thereof include 3,3-bis(p-dimethylaminophenyl)-6-dimethylaminophthalide, 3,3-bis(p-diethylaminophenyl)phthalide, 3,3-bis(2-methyl-1-octylindole-3-yl)phthalide, 3-(4-dipropylamino-2-acetylaminophenyl)-3-(2-methyl-1-octylindole-3-yl)-4-azaphthalide, 3-(4-diethylamino-2-ethoxyphenyl)-3-(2-methyl-1-octylindole-3-yl)phthalide, 3-(4-diethylamino-2-ethoxyphenyl)-3-(2-methyl-1-octylindole-3-yl)-4-azaphthalide, 3-(4-diethylamino-2-methylphenyl)-3-(1-ethyl-2-methylindole-3-yl)-4-azaphthalide, 3,3-bis(4-diethylamino-2-butyloxyphenyl)-4-azaphthalide, 3-(4-ethylamino-2-butyloxyphenyl)-3-(2-methyl-1-pentylindole-3-yl)-4-azaphthalide, and so on.

Examples of the fluoran-based compound include the compounds described in, for example, U.S. Pat. Nos. 3,624,107, 3,627,787, 3,641,011, 3,462,828, 3,681,390, 3,920,510, and 3,959,571. Specific examples thereof include 2-anilino-3-methyl-6-diethylaminofluoran, 2-anilino-3-methyl-6-dibutylaminofluoran, 2-anilino-3-methyl-6-N-ethyl-N-isoamylaminofluoran, 2-anilino-3-methyl-6-N-methyl-N-cyclohexylaminofluoran, 2-anilino-3-methyl-6-N-ethyl-N-isobutylaminofluoran, 2-anilino-6-dibutylaminofluoran, 2-anilino-3-methyl-6-N-methyl-N-tetrahydrofurfurylaminofluoran, and so on.

Examples of the thiazine-based compound include benzoyl leucomethylene blue, p-nitrobenzyl leucomethylene blue, and so on.

Examples of the leucoauramine-based compounds include 4,4'-bis-dimethylaminobenzhydrin benzyl ether, N-halophenyl leucoauramine, N-2,4,5-trichlorophenyl leucoauramine, and so on.

Examples of the rhodamine lactam-based compound include rhodamine-B-anilinolactam, rhodamine-(p-nitrino) lactam, and so on.

Examples of the spiropyran-based compound include the compounds described in, for example, U.S. Pat. No. 3,971,808. Specific examples thereof include 3-methyl-spiro-dinaphthopyran, 3-ethyl-spiro-dinaphthopyran, 3,3'-dichloro-spiro-dinaphthopyran, 3-benzylspiro-dinaphthopyran, 3-methyl-naphto-(3-methoxybenzo) spiropyran, 3-propyl-spiro-dibenzopyran, and so on.

Examples of the pyridine-based compound and pyrazine-based compound include the compounds described in, for example, U.S. Pat. Nos. 3,775,424, 3,853,869, and 4,246,318.

Examples of the fluorene-based compound include the compounds described in, for example, Japanese Patent Application No. 61-240989.

As the dye precursors, which develop cyan, magenta, and yellow colors, the dye precursors described in, for example, U.S. Pat. No. 4,800,149 can be used.

Further, as the electron-donating dye precursors for developing yellow colors, the dye precursors described in, for example, U.S. Pat. Nos. 4,800,148 and 5,126,233, and JP-B No. 7-88105 can also be used. As the electron-donating dye precursors for developing cyan colors, the dye precursors described in, for example, JP-A No. 63-53542 can also be used.

When the electron-donating dye precursor is used, an electron-accepting compound is used as the color-forming component B that causes the electron-donating dye precursor to develop a color.

Examples of the electron-accepting compound include a phenol derivative, a salicylic acid derivative, a metal salt of an aromatic carboxylic acid, acid clay, bentonite, a novolak resin, a metal-treated novolak resin, a metal complex, and the like all known in heat-sensitive paper, pressure-sensitive paper, and the like. Specific examples thereof are described in, for example, JP-B Nos. 40-9309 and 45-14039, JP-A Nos. 52-140483, 48-51510, 57-210886, 58-87089, 59-11286, 60-176795, and 61-95988.

Among the substances listed above, examples of the phenol derivative include 2,2-bis(4-hydroxy)phenolpropane, 1,1-bis(3-chloro-4-hydroxyphenyl)cyclohexane, 4-hydroxyphenyl-4'-isopropyloxyphenyl sulfone, bis(3-allyl-hydroxyphenyl)sulfone, α,α'-bis(4- hydroxyphenyl)-1,4-diisopropylbenzene, benzyl p-hydroxybenzoate, and so on.

Examples of the salicylic acid derivative include 4-pentadecylsalicylic acid, 3,5-di(α-methylbenzyl)salicylic acid, 3,5-di(tert-octyl)salicylic acid, 5-octadecylsalicylic acid, 5-α-(p-α-methylbenzylphenyl)ethylsalicylic acid, 3-α-methylbenzyl-5-tert-octylsalicylic acid, 5-tetradecylsalicylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, zinc salts of these acids, aluminum salts of these acids, calcium salts of these acids, copper salts of these acids, and so on.

In the recording material according to the first object, the color-forming component B functions also as a polymerizable compound having an ethylenically unsaturated bond. Accordingly, at least one of the polymerizable compounds of the recording material according to the first object is an electron-accepting compound having in the molecule thereof an electron-accepting group and an ethylenically unsaturated bond (hereinafter referred to as "a polymerizable group").

Examples of such color-forming component B include the compounds that can be synthesized by referring to, for example, 3-halo-4-hydroxybenzoic acid described in JP-A No. 4-226455, methacryloxyethyl esters and acryloxyethyl esters of hydroxy-bearing benzoic acid which are described in JP-A No. 63-173682, esters of hydroxy-bearing benzoic acid and hydroxymethylstyrene which are described in JP-A Nos. 59-83693, 60-141587, and 62-99190, hydroxystyrene described in European Patent No. 29323, N-vinylimidazole complexes of zinc halides described in JP-A Nos. 62-167077 and 62-16708, and electron-accepting compounds described in JP-A No. 63-317558.

Among these compounds having in the molecule thereof an electron-accepting group and a polymerizable group, preferable is 3-halo-4-hydroxybenzoic acids represented by the following general formula:

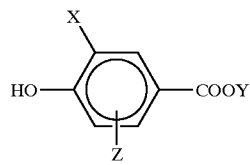

In the formula described above, X is a halogen atom and preferably a chlorine atom. Y is a monovalent group having a polymerizable ethenyl group, preferably an aralkyl group having a vinyl group, acryloyloxyalkyl group, or methacryloyloxyalkyl group, and more preferably an acryloyloxyalkyl group having 5 to 11 carbon atoms, or a methacryloyloxyalkyl having 6 to 12 carbon atoms. Z represents a hydrogen atom, an alkyl group, or an alkoxy group.

Examples of the 3-halo-4-hydroxybenzoic acids include 3-chloro-4-hydroxybenzoic acid vinylphenethyl ester, 3-chloro-4-hydroxybenzoic acid vinylphenylpropyl ester, 3-chloro-4-hydroxybenzoic acid 2-acryloyloxyethyl ester, 3-chloro-4-hydroxybenzoic acid 2-methacryloyloxyethyl ester, 3-chloro-4-hydroxybenzoic acid 2-acryloyloxypropyl ester, 3-chloro-4-hydroxybenzoic acid 2-methacryloyloxypropyl ester, 3-chloro-4-hydroxybenzoic acid 3-acryloyloxypropyl ester, 3-chloro-4-hydroxybenzoic acid 3-methacryloyloxypropyl ester, 3-chloro-4-hydroxybenzoic acid 4-acryloyloxybutyl ester, 3-chloro-4-hydroxybenzoic acid 4-methacryloyloxybutyl ester, 3-chloro-4-hydroxybenzoic acid 2-acryloyloxyethyl ester, 3-chloro-4-hydroxybenzoic acid 5-acryloyloxypentyl ester, 3-chloro-4-hydroxybenzoic acid 5-methacryloyloxypentyl ester, 3-chloro-4-hydroxybenzoic acid 6-acryloyloxyhexyl ester, 3-chloro-4-hydroxybenzoic acid 6-methacryloyloxyhexyl ester, 3-chloro-4-hydroxybenzoic acid 8-acryloyloxyoctyl ester, 3-chloro-4-hydroxybenzoic acid 8-methacryloyloxyoctyl ester, and so on.

In addition, the following are also suitable: Styrenesulfonylaminosalicylic acid, vinylbenzyloxyphthalic acid, zinc β-methacryloxyethoxysalicylate, zinc β-acrylbxyethoxysalicylate, vinyloxyethyl oxybenzoate, β-methacryloxyethyl orsellinate, β-acryloxyethyl orsellinate, β-methacryloxyethoxyphenol, β-acryloxyethoxyphenol, β-methacryloxyethyl-β-resorcinate, β-acryloxyethyl-β-resorcinate, hydroxystyrenesulfonic acid-N-ethylamide, β-methacryloxypropyl-p-hydroxybenzoate, β-acryloxypropyl-p-hydroxybenzoate, methacryloxymethylphenol, acryloxymethylphenol, methacrylamidepropanesulfonic acid, acrylamidepropanesulfonic acid, β-methacryloxyethoxy-dihydroxybenzene, β-acryloxyethoxy-dihydroxybenzene, v-styrenesulfonyloxy-β-methacryloxypropanecarboxylic acid, v-acryloxypropyl-α-hydroxyethyloxysalicylic acid, β-hydroxyethoxylphenol, β-methacryloxyethyl-p-hydroxycinnamate, β-acryloxyethyl-p-hydroxycinnamate, 3,5-distyrenesulfonic acidamidephenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxylphenol, β-methacryloxyethylphenol-p-hydroxybenzoate, β-acryloxyethyl-p-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and metal salts (e.g., zinc salts and the like) thereof.

When the electron-donating dye precursor is used as the color-forming component A and the electron-accepting compound is used as the color-forming component B, the content of the electron-donating dye precursor in the recording layer is preferably 0.05 to 5 g/m², and more preferably 0.1 to 3 g/m².

The amount to be used of the electron-accepting compound is preferably 0.5 to 20 parts by weight, more preferably 3 to 10 parts by weight, per part by weight of the electron-donating, colorless dye. If the amount is less than 0.5 part by weight, sufficient density of developed color may not be obtained, whereas, if the amount exceeds 20 parts by weight, sensitivity may drop or coatability may become inferior.

When a diazo compound is used as the color-forming component A, it is preferable to use a compound represented by the following formula:

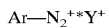

where Ar represents an aromatic group and Y⁺ represents an acid anion.

In the general formula described above, Ar represents a substituted or unsubstituted aryl group. Examples of the substituent include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, a ureido group, a halogen group, an amino group, a heterocyclic group, and so on. These substituents may be further substituted.

The aryl group is preferably an aryl group having 6 to 30 carbon atoms. Examples of the aryl group include a phenyl group, a 2-methylphenyl group, a 2-chlorophenyl group, a 2-methoxyphenyl group, a 2-butoxyphenyl group, a 2-(2-ethylhexyloxy)phenyl group, a 2-octyloxyphenyl group, a 3-(2,4-di-t-pentylphenoxyethoxy)phenyl group, a 4-chlorophenyl group, a 2,5-dichlorophenyl group, a 2,4,6-trimethylphenyl group, a 3-chlorophenyl group, a 3-methylphenyl group, a 3-methoxyphenyl group, a 3-butoxyphenyl group, a 3-cyanophenyl group, a 3-(2-ethylhexyloxy)phenyl group, a 3,4-dichlorophenyl group, a 3,5-dichlorophenyl group, a 3,4-dimethoxyphenyl group, a 3-(dibutylaminocarbonylmethoxy)phenyl group, a 4-cyanophenyl group, a 4-methylphenyl group, a 4-methoxyphenyl group, a 4-butoxyphenyl group, a 4-(2-ethylhexyloxy)phenyl group, a 4-benzylphenyl group, a 4-aminosulfonylphenyl group, a 4-N,N-dibutylaminosulfonylphenyl group, a 4-ethoxycarbonylphenyl group, a 4-(2-ethylhexylcarbonyl)phenyl group, a 4-fluorophenyl group, a 3-acetylphenyl group, a 2-acetylaminophenyl group, a 4-(4-chlorophenylthio)phenyl group, a 4-(4-methylphenyl)thio-2,5-butoxyphenyl group, a 4-(N-benzyl-N-methylamino)-2-dodecyloxycarbonylphenyl group, and so on.

These groups may be further substituted by an alkyloxy group, an alkylthio group, a substituted phenyl group, a cyano group, a substituted amino group, a halogen atom, a heterocyclic group, and the like.

Examples of the diazo compound that can be suitably used as the color-forming component A include the diazo compounds listed in JP-A No. 7-276808, paragraphs 44 to 49. It should be noted, however, that, in the present invention, the diazo compounds are not limited to these compounds.

From the standpoint of effects, the maximum absorption wavelength $\lambda_{max}$ of the diazo compound is preferably 450 nm or less and more preferably 290 to 440 nm. In addition, it is desirable that the diazo compound has 12 or more carbon atoms and has a solubility in water of 1% or less and a solubility in ethyl acetate of 5% or more.

The diazo compounds as the color-forming component A may be used singly or in combinations of two or more kinds.

When the diazo compound described above is used, a coupler compound (having no polymerizable group) or a coupler compound having a polymerizable group is used as the color-forming component B.

Both of the above-mentioned coupler compounds undergo a coupling reaction with a diazo compound to form a dye in a basic environment and/or a neutral environment. According to purposes such as color adjustment, a plurality of kinds of coupler compounds can be used together.

Examples of the coupler compound having a polymerizable group include a so-called active methylene compound having a methylene group adjacent to a carbonyl group, a phenol derivative, a naphthol derivative, an azole derivative, and a heterocycle-condensed azole derivative. These coupler compounds are appropriately selected in so far as these coupler compounds meet the purpose of the present invention.

As coupler skeletal compounds (couplers) in the coupler compounds having the polymerizable group, preferably used are a so-called active methylene compound having a methylene group adjacent to a carbonyl group, a phenol derivative, a naphthol derivative, an azole derivative, and a heterocycle-condensed azole derivative. Specific examples thereof include resorcinol, fluoroglycine, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalenesulfonate, 2-hydroxy-3-naphthalenesulfonic acidanilide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethylhexylamide, 5-acetamido-1-naphthol, sodium 1-hydroxy-8-acetamidonaphthalene-3,6-disulfonate, 1-hydroxy-8-acetamidonaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamido-5-pyrazolone, 6-hydroxy-4-methyl-3-cyano-1-(2-ethylhexyl)-2-pyridone, 2,4-bis(benzoylacetamido)toluene, 1,3-bis(pivaloylacetamidomethyl)benzene, benzoylacetonitrile, thenoylacetonitrile, acetoacetanilide, benzoylacetanilide, pivalolylacetanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one, 1-(4-n-octyloxyphenyl)-3-tert-butyl-5-aminopyrazole and so on.

For details of the coupler compounds, reference can be made to those described in, for example, JP-A Nos. 4-201483, 7-223367, 7-223368, 7-323660 5-278608, 5-297024, 6-18669, 6-18670, 7-316280, 9-216468, 9-216469, 9-319025, 10-035113, 10-193801, and 10-264532.

The coupler compounds undergo a coupling reaction with a diazo compound to form a dye in a basic environment and/or a neutral environment. According to purposes such as color adjustment, a plurality of kinds of coupler compounds can be used together.

Specific examples of the coupler having a polymerizable group are given below. It should be noted that, in the present invention, the couplers are not limited to these examples.

B-1

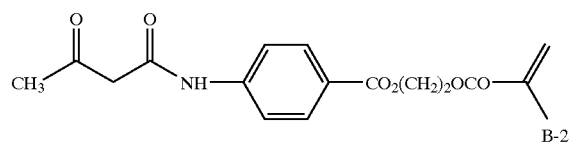

B-2

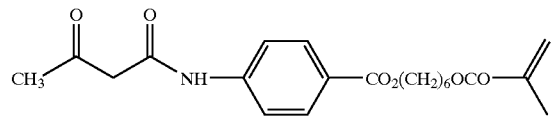

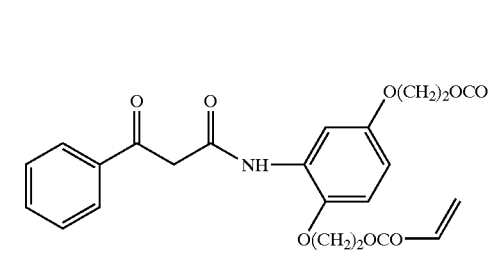
B-3
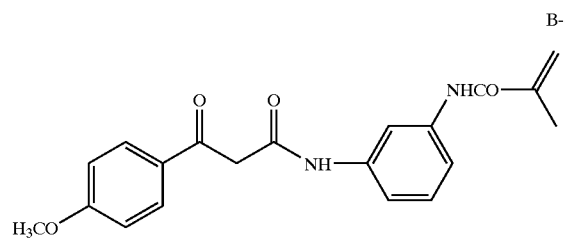
B-4
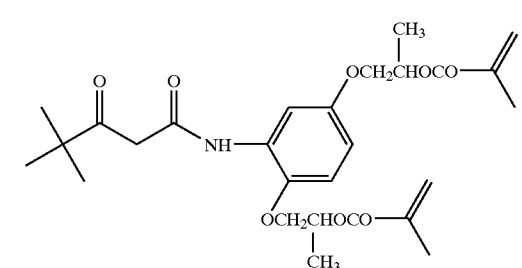
B-5
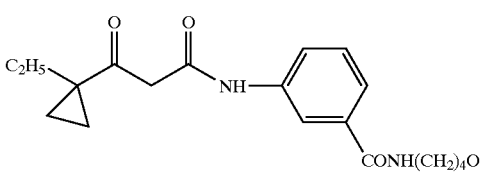
B-6
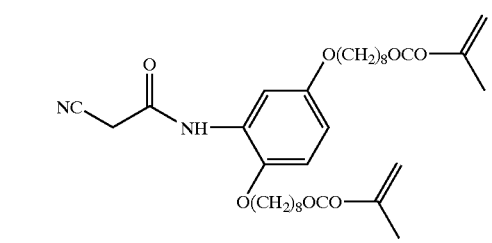
B-7
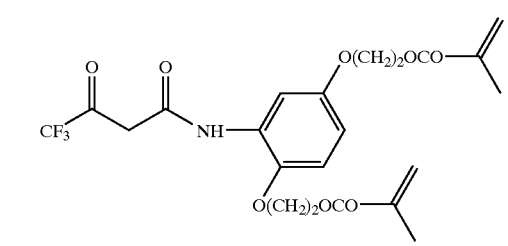
B-8
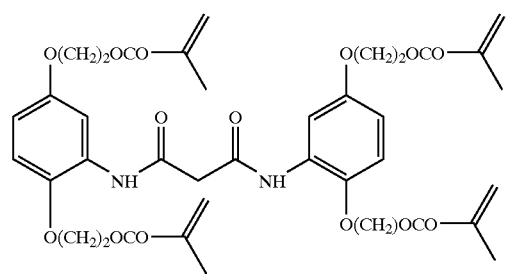
B-9
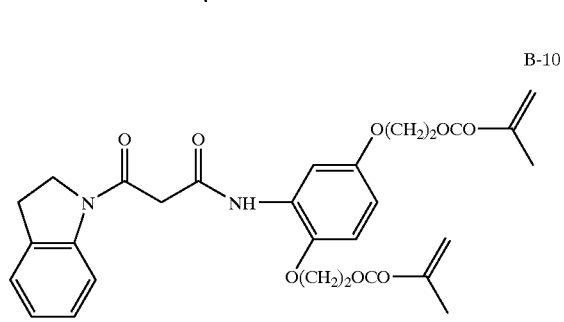
B-10
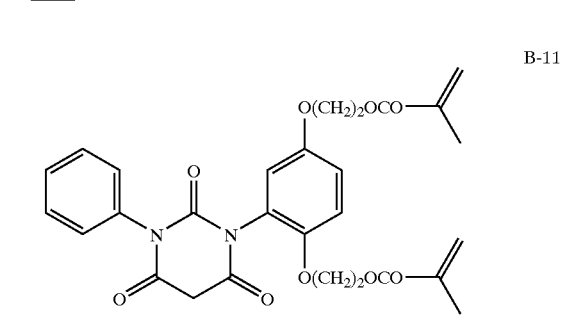
B-11
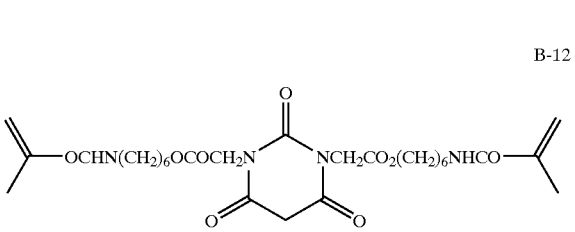
B-12
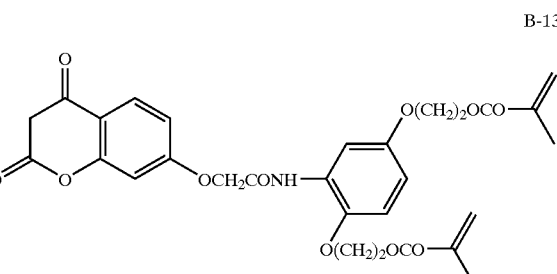
B-13
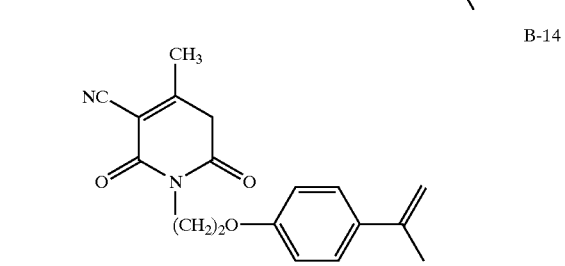
B-14

B-15 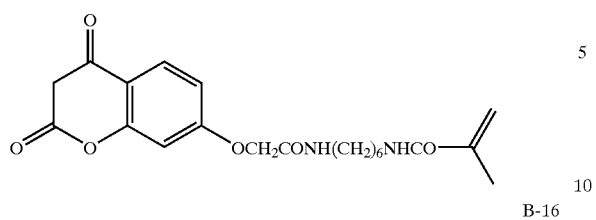
B-16 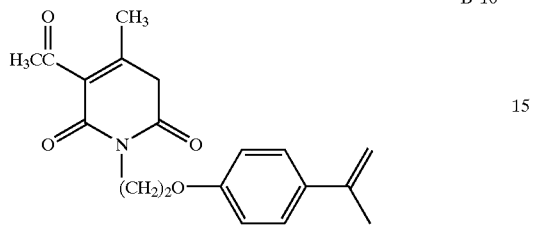
B-17 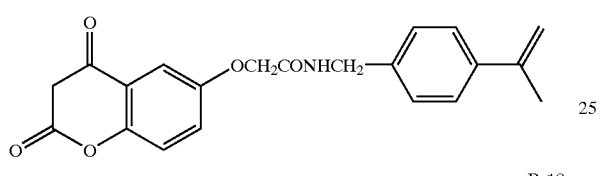
B-18 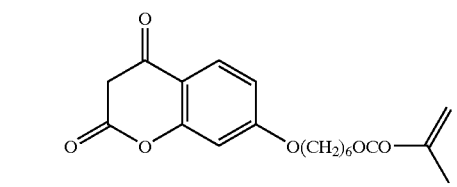
B-19 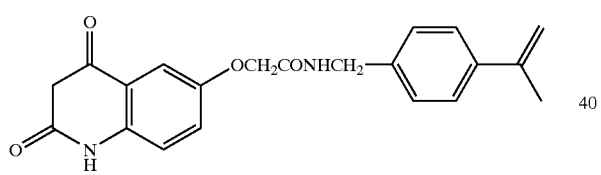
B-20 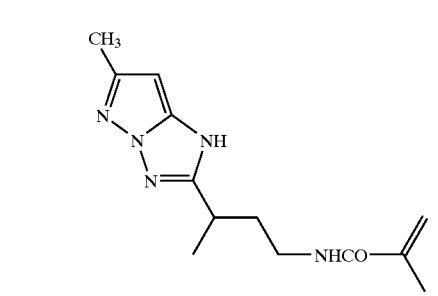
B-21 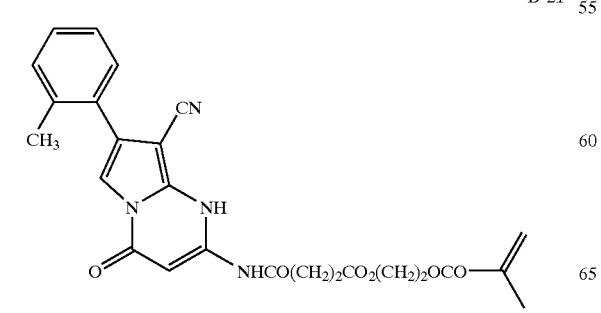
B-22 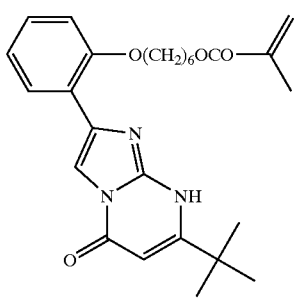
B-23 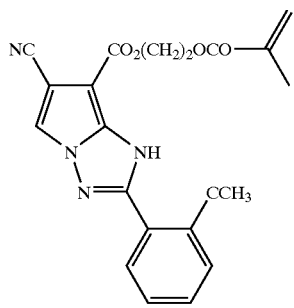
B-24 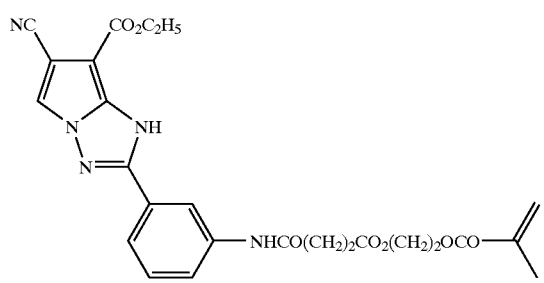
B-25 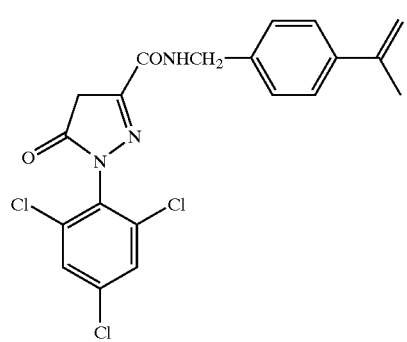
B-26 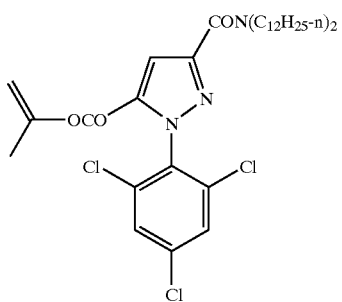

B-27
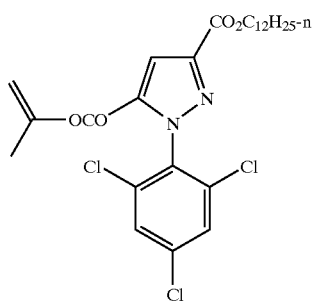

B-28
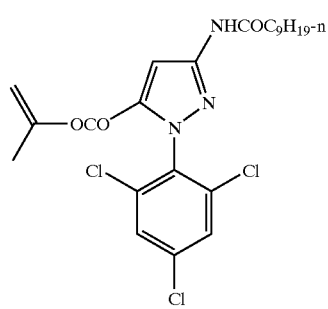

B-29
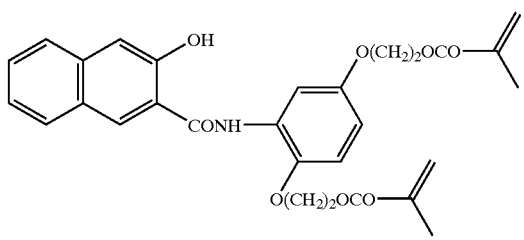

B-30
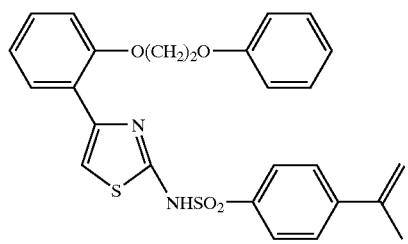

B-31
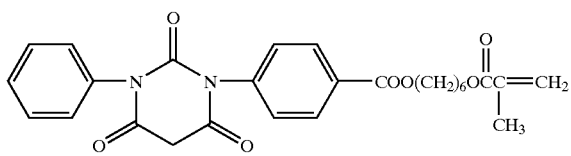

B-32
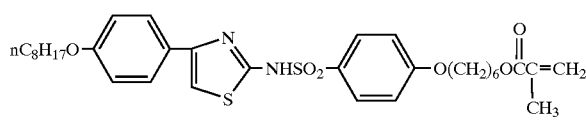

B-33
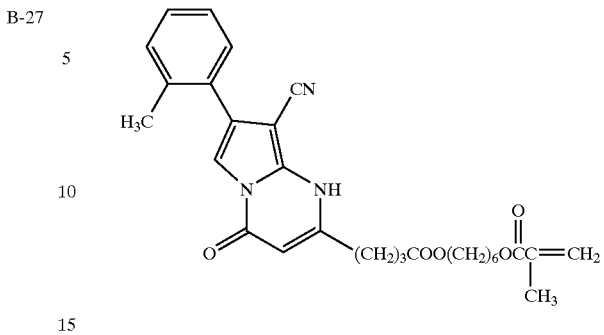

Examples of the coupler compound having no polymerizable group include the compounds listed as the coupler skeletal compounds in the examples of the coupler compound having the polymerizable group.

When the diazo compound is used as the color-forming component A and the coupler is used as the color-forming component B, the content of the diazo compound in the recording layer is preferably 0.02 to 5.0 g/m², and more preferably 0.05 to 3.0 g/m².

If the content is less than 0.02 g/m², sufficient density of developed color may not be obtained, whereas, if the content exceeds 5.0 g/m², coatability of the coating liquid may become inferior.

The amount to be used of the coupler compound is preferably 0.5 to 20 parts by weight, more preferably 1 to 10 parts by weight, per part by weight of the diazo compound. If the amount is less than 0.5 part by weight, sufficient density of developed color may not be obtained, whereas, if the amount exceeds 20 parts by weight, coatability may become inferior.

The coupler compound to be used as the color-forming component B can be used as a solid-state dispersion prepared by dispersing the coupler compound together with other components in the presence of a water-soluble polymer in a sand mill or the like. The coupler compound can also be used as an emulsion prepared by emulsifying the coupler compound in the presence of a suitable emulsifying aid. The solid-state dispersing method and the emulsifying method are not particularly limited, and methods hitherto known can be employed. The details of these methods are described in JP-A Nos. 59-190886, 2-141279, and 7-17145.

It is preferable to use an organic base, such as a tertiary amine, a piperizine, a piperazine, an amidine, a formamidine, a pyridine, a guanidine, a morpholine, or the like, in order to accelerate the coupling reaction between the diazo compound and the coupler.

Specific examples of the organic base include piperazines such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, and 1,4-bis{[3-(N-methylpiperazino)-2-hydroxy]propyloxy}benzene; morpholines such as N-[3-(β-naphthoxy)-2-hydroxy]

propylmorpholine, 1,4-bis[(3-morpholino-2-hydroxy) propyloxy]benzene, and 1,3-bis[(3-morpholino-2-hydroxy) propyloxy]benzene; piperidines such as N-(3-phenoxy-2-hydroxypropyl)piperidine and N-dodecylpiperidine; triphenylguanidine. tricyclohexylguanidine, dicyclohexylguanidine, 4-hydroxybenzoic acid 2-N-methyl-N-benzylaminoethyl ester, 4-hydroxybenzoic acid 2-N,N-di-n-butylaminoethyl ester, 4-(3-N,N-dibutylaminopropoxy)benzenesulfonamide, 4-(2-N,N-dibutylaminoethoxycarbonyl)phenoxyacetic acid amide, and so on.

These organic bases may be used singly or in combinations of two or more kinds.

These organic bases are described in, for example, JP-A Nos. 57-123086 and 60-49991, and Japanese Patent Application Nos. 7-228731, 7-235157, and 7-235158.

When the organic base is used, an organic base having a polymerizable group may be used as the organic base.

When an organic base having a polymerizable group is used in the recording material according to the first object, it is also possible to enclose the diazo compound and the coupler together in microcapsules as the color-forming components A and to function as the organic base having a polymerizable group as a color-forming component B. When the diazo compound and the coupler are enclosed in microcapsules as the color-forming components A, the diazo compound and the coupler are used in a combination in which a color-forming reaction does not occur without the presence of a base.

In addition, in the recording material according to the first object, it is also possible to use the diazo compound as the color-forming component A and to use a combination of the coupler having a polymerizable group and the organic base having a polymerizable group as the color-forming component B.

The amount to be used of the organic base is not particularly limited, but it is preferable to use the organic base in an amount falling in a range of 1 to 30 moles per mole of the diazo compound.

A color development aid can be added in order to accelerate the color-forming reaction. Examples of the color development aid include a phenol derivative, a naphthol derivative, an alkoxy-substituted benzene, an alkoxy-substituted naphthalene, a hydroxy compound, a carboxylic acid amide, a sulfonamide compound, and so on.

Next, the polymerizable compounds that are used in the recording material according to the second object are explained below.

In the recording material according to the second object, the recording layer thereof contains as polymerizable compounds a color-forming component A and a color formation inhibiting compound (this compound is hereinafter referred to as "a polymerizable, color formation inhibiting compound upon occasion") having in the molecule thereof a site inhibiting the reaction between the color-forming component A and the color-forming component B which reacts with the color-forming component A and causes the color-forming component A to develop a color.

When the electron-donating dye precursor is used as the color-forming component A and the electron-accepting compound having no polymerizable group is used as the color-forming component B, it is preferable to use, as the polymerizable, color formation inhibiting compound, a photopolymerizable monomer (hereinafter referred to as "a photopolymerizable monomer $D_1$" upon occasion) having in the molecule thereof a site inhibiting the reaction between the electron-donating dye precursor and the electron-accepting compound and at least one vinyl group.

Specific examples of the photopolymerizable monomer $D_1$ include acrylic acid and salts thereof, acrylates, and acrylamides; methacrylic acid and salts thereof, methacrylates, and methacrylamides; maleic acid and maleates; itaconic acid and itaconates; styrenes; vinyl ethers; vinyl esters; N-vinyl heterocycles; allyl ethers and ally esters, and so on.

Among these monomers, compounds having in the molecule thereof a plurality of vinyl groups are preferable. Specifically, preferable are acrylic acid or methacrylic acid esters of polyhydric alcohols such as trimethylolpropane and pentaerythritol; acrylic acid or methacrylic acid esters of polyhydric phenols and biphenols such as resorcinol, pyrogallol, and fluoroglucinol; acrylate- or methacrylate-endstopped epoxy resins; and acrylate- or methacrylate-endstopped polyesters.

Among these compounds, particularly preferable are ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate, and diethylene glycol dimethacrylate.

The molecular weight of the photopolymerizable monomer $D_1$ is preferably 100 to about 5000, and more preferably about 300 to about 2000.

When the photopolymerizable monomer $D_1$ is used as the polymerizable, color formation inhibiting compound, the amount to be used is preferably 0.1 to 10 parts by weight, more preferably 0.5 to 5 parts by weight, per part by weight of the electron-donating compound to be used in combination with the coupler compound having no polymerizable group. If the amount is less than 0.1 part by weight, latent images may not be formed in the exposing step, whereas, if the amount exceeds 10 parts by weight, the density of developed color may drop.

When a diazo compound is used as the color-forming component A and the coupler compound having no polymerizable group is used as the color-forming component B, it is preferable to use, as the polymerizable, color formation inhibiting compound, a photopolymerizable monomer (hereinafter referred to as "a photopolymerizable monomer $D_2$" upon occasion) having in the molecule thereof an acidic group inhibiting the coupling reaction between the diazo compound and the coupler compound and at least one vinyl group.

Suitable examples of the photopolymerizable monomer $D_2$ include styrenesulfonylaminosalicylic acid, vinylbenzyloxyphthalic acid, zinc β-methacryloxyethoxysalicylate, zinc β-acryloxyethoxysalicylate, vinyloxyethyl oxybenzoate, β-methacryloxyethyl orsellinate, β-acryloxyethyl orsellinate, β-methacryloxyethoxyphenol, β-acryloxyethoxyphenol, β-methacryloxyethyl-β-resorcinate, β-acryloxyethyl-β-resorcinate, hydroxystyrenesulfonic acid-N-ethylamide, β-methacryloxypropyl-p-hydroxybenzoate, β-acryloxypropyl-p-hydroxybenzoate, methacryloxymethylphenol, acryloxymethylphenol, methacrylamidepropanesulfonic acid, acrylamidepropanesulfonic acid, β-methacryloxyethoxy-dihydroxybenzene, β-acryloxyethoxy-dihydroxybenzene, v-styrenesulfonyloxy-β-methacryloxypropanecarboxylic acid, v-acryloxypropyl-α-hydroxyethyloxysalicylic acid, β-hydroxyethoxylphenol, β-methacryloxyethyl-p-hydroxycinnamate, β-acryloxyethyl-p-hydroxycinnamate, 3,5-distyrenesulfonic acidamidephenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxylphenol, β-methacryloxyethylphenol-p- hydroxybenzoate, β-acryloxyethyl-p-hydroxybenzoate, β'-methacryloxyethyl-β-resorcinate, β-methacryloxy- ethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and so on.

When the photopolymerizable monomer $D_2$ is used as the polymerizable, color formation inhibiting compound, the amount to be used is preferably 0.1 to 10 parts by weight, more preferably 0.5 to 5 parts by weight, per part by weight of the coupler compound to be used in combination with the coupler compound having no polymerizable group. If the amount is less than 0.1 part by weight, latent images may not be formed in the exposing step, whereas, if the amount exceeds 10 parts by weight, the density of developed color may drop.

(Microcapsules)

In the recording material of the present invention, the recording layer contains the color-forming component A preferably in a state encapsulated in microcapsules.

For the encapsulation, a conventionally known method can be employed. Examples of the method include a method utilizing coacervation of a hydrophilic wall-forming material described in U.S. Pat. Nos. 2,800,457 and 2,800,458; an interfacial polymerization method described in U.S. Pat. No. 3,287,154, U.K. Patent No. 990,443, and JP-B Nos. 38-19574, 42-446, and 42-771; a method utilizing polymer deposition described in U.S. Pat. Nos. 3,418,250 and 3,660,304; a method utilizing an isocyanate-polyol wall forming material described in U.S. Pat. No. 3,796,669; a method utilizing an isocyanate wall forming material described in U.S. Pat. No. 3,914,511; a method utilizing urea-formaldehyde and urea-formaldehyde-resorcinol wall-forming materials described in U.S. Pat. Nos. 4,001,140, 4,087,376, and 4,089,802; a method utilizing wall-forming materials such as a melamine-formaldehyde resin and hydroxypropylcellulose described in U.S. Pat. No. 4,025,455; an in-situ method utilizing a polymerization of monomers described in JP-B No. 36-9168 and JP-A No. 51-9079; a method utilizing electrolytic dispersion cooling described in U.K. Patent Nos. 952,807 and 965,074; and a spray-drying method described in U.S. Pat. No. 3,111,407 and U.K. Patent No. 930,442.

The encapsulating method is not limited to the methods listed above. However, it is particularly preferable to employ a interfacial polymerization method comprising the steps of mixing an oil phase, prepared by dissolving or dispersing the color-forming component A in a hydrophobic organic solvent that becomes the core of the capsules, and an aqueous phase having a water-soluble polymer dissolved therein, emulsifying the mixture by means of a homogenizer or the like, heating the emulsion so as to cause a polymer-forming reaction at the interface of droplets so that polymeric microcapsule walls are formed. This method makes it possible to form capsules having uniform particle diameters in a short period of time and to obtain a recording material excellent in storability as a raw recording material.

The reactants that form the polymer are added to the inside of the droplets and/or the outside of the droplets. Examples of the polymeric substance include polyurethane, polyurea, polyamide, polyester, polycarbonate, urea/formaldehyde resins, melamine resins, polystyrene, styrene/methacrylate copolymers, styrene/acrylate copolymers, and so on. Among these substances, polyurethane, polyurea, polyamide, polyester, and polycarbonate are preferable, and polyurethane and polyurea are particularly preferable. The above-listed polymeric substances may be used in combination of two or more kinds.

Examples of the water-soluble polymers include gelatin, polyvinyl pyrrolidone, polyvinyl alcohol, and so on. For example, when polyurethane is used as capsule wall material, the microcapsule wall can be formed by mixing a polyvalent isocyanate and a second substance (e.g., polyol or polyamine) that reacts therewith to form the capsule wall in a water-soluble polymer solution (i.e., aqueous phase) or in an oily medium (oil phase) to be encapsulated, emulsifying the mixture, and heating the resulting emulsion so as to cause a polymer-forming reaction at the interface of droplets.

As the polyvalent isocyanate and the polyol or polyamine, with which the polyvalent isocyanate reacts, those that are described in U.S. Pat. Nos. 3,281,383, 3,773,695, and 3,793,268, JP-B Nos. 48-40347 and 49-24159, and JP-A Nos. 48-80191 and 48-84086 can be used.

When microcapsules containing the color-forming component A are prepared, the color-forming component A to be enclosed in the microcapsules may be present in a state of a solution or may be present in a state of a solid inside the microcapsules.

When enclosing the color-forming component A present in a state of a solution inside the microcapsules, the color-forming component A, which is dissolved in a hydrophobic solution, is encapsulated. The amount of the organic solvent to be used is preferably 1 to 500 parts by weight per 100 parts by weight of the color-forming component A.

Examples of the organic solvent usually employed include a phosphate, a phthalate, an acrylate, a methacrylate, other carboxylates, a fatty acid amide, an alkylated biphenol, an alkylated terphenol, a chlorinated paraffin, an alkylated naphthalene, diallyl ethane, a compound that is a solid at room temperature, an oligoner oil, a polymer oil, and so on. Specific examples of the organic solvent include the organic solvents described in JP-A Nos. 59-178451 to 59-178455, 59-178457, 60-242094, 63-85633, 6-194825, 7-13310 to 7-13311, and 9-106039, and Japanese Patent Application No. 62-75409.

When the color-forming component A to be encapsulated has a poor solubility in the organic solvent, a low-boiling solvent having a high solvency may be used as an auxiliary solvent. Examples of the low-boiling solvent include ethyl acetate, propyl acetate, isopropyl acetate, butyl acetate, methylene chloride, and so on.

An aqueous solution having a water-soluble polymer dissolved therein is used as the aqueous phase. The oil phase described above is added to the aqueous phase and thereafter the mixture is emulsified by means of a homogenizer or the like. The water-soluble polymer acts as a dispersing medium which enables uniform and easy dispersion and stabilizes the aqueous dispersion thus obtained. In this case, in order to obtain a further uniform and stable dispersion, a surfactant may be added to at least one of the oil phase and the aqueous phase. As the surfactant, a conventionally known surfactant for emulsification maybe used. When the surfactant is added, the amount of the surfactant to be added is preferably 0.1 to 5% by weight, particularly preferably 0.5 to 2% by weight, based on the weight of the oil phase.

When the color-forming component A is encapsulated, the average particle diameter of the microcapsules is preferably $20\mu m$ or less, and more preferably $5\mu m$ or less, from the standpoint of obtaining high resolution. If the microcapsules formed are too small, a larger amount of wall-forming agents is required because the surface area per amount of the solid components becomes larger. Therefore, the average particle diameter of the microcapsules is preferably 0.1 μm or greater.

Besides the recording material of the present invention described above, the photopolymerizable composition of the present invention can be used in a broad application field including ink, color filter, hologram, proof, sealant, adhesive, planographic printing, resin relief plate, and photoresist. In accordance with the applications, other components may be added. Further, when the photopolymerizable composition of the present invention is used in an application other than the recording material of the present invention, the polymerizable compound (3) does not need to function as the color-forming component B and color formation inhibiting compound, and therefore a wide range of polymerizable compounds having an ethylenically unsaturated bond can be used.

A multicolor recording material can be formed by laminating a plurality of single-color recording layers on a support, wherein each recording layer contains a color-forming component A (which may be enclosed in microcapsules) designed to develop a different color, a color-forming component B (which may have a polymerizable group) having in the molecule thereof a site which reacts with the color-forming component A and causes the color-forming component A to develop a color, and a photopolymerizable composition which is sensitized by a different wavelength of light to form a latent image. That is, it is possible to obtain photopolymerizable compositions sensitive to different wavelengths of light by incorporating spectrally sensitizing dyes each having a different absorption wavelength into the photopolymerizable compositions. In this case, an intermediate layer can be formed between the single-color recording layers.

The multicolor recording material of the present invention can be formed in the following way.

That is, a multilayer recording layer a having a multilayer structure is produced by disposing on the support a first recording layer which contains microcapsules enclosing a yellow color-forming component $A^Y$, a color-forming component $B^Y$ causing the color-forming component $A^Y$ to develop a color, and a photopolymerizable composition sensitive to the light having a central wave length of $\lambda_1$ so as to form a latent image, disposing on the first recording layer a second recording layer which contains microcapsules enclosing a magenta color-forming component $A^M$, a color-forming component $B^M$ causing the color-forming component $A^M$ to develop a color, and a photopolymerizable composition sensitive to the light having a central wave length of $\lambda_2$ so as to form a latent image, and disposing on the second recording layer a third recording layer which contains microcapsules enclosing a cyan color-forming component $A^C$, a color-forming component $B^C$ causing the color-forming component $A^C$ to develop a color, and a photopolymerizable composition sensitive to the light having a central wave length of $\lambda_3$ so as to form a latent image. If necessary, the multicolor recording material of the present invention may be comprised of a multilayer recording layer β or the like which has intermediate layers formed between layers of the multilayer recording layer α.

In the case where image formation is carried out by using the recording material having the multicolor, multilayer recording layer described above, image-wise exposure is made at an exposing step to a plurality of light sources of different wavelengths suited to the respective absorption wavelengths of the recording layers. This exposure enables the recording layers, whose absorption wavelengths are each equal to the light of the light source, to form images selectively. Therefore, multicolor images with high sensitivity and clarity can be formed. Further, when the entire surface of the recording layer is irradiated with light, the background colored due to the spectrally sensitizing dye remaining in the layer and the photopolymerizable composition can be decolorized. As a result, high-quality, multicolor images with high contrast can be formed.

(Support)

Any of ordinary pressure-sensitive paper, heat-sensitive paper, and paper supports for dry-process or wet-process diazo copying paper can be used as the support. In addition, an acidic paper, a neutral paper, a coated paper, a plastic film-laminated paper, a synthetic paper, a plastic film, or the like can be used.

In the recording material according to the first or second object, other layers, such as a primer layer, an intermediate layer, a light-absorbing layer, a protective layer, a backcoat layer, or the like, may be formed besides the recording layer.

It is preferable that each of the primer layer, intermediate layer, light-absorbing layer, protective layer, backcoat layer, and the like contains a hardening agent, and it is particularly preferable that the protective layer contain a hardening agent. As the hardening agent, for example, "a gelatin-hardening agent", which is used for the manufacture of a photographic photosensitive material is useful. Examples of the hardening agent include aldehyde-based compounds, such as formaldehyde and glutaraldehyde, halogen-containing compounds described in, for example, U.S. Pat. No. 3,635,718, compounds having a reactive ethylenically unsaturated bond described in, for example, U.S. Pat. No. 3,635,718, aziridine-based compounds described in, for example, U.S. Pat. No. 3,017,280, epoxy-based compounds, halogenocarboxyaldehydes such as mucochloric acid, and dioxanes such as dihydroxydioxane and dichlorodioxane described in, for example, U.S. Pat. No. 3,091,537, vinylsulfones described in U.S. Pat. Nos. 3,642,486 and 3,687,707, vinylsulfone precursors described in U.S. Pat. No. 3,841,872, ketovinyls described in U.S. Pat. No. 3,640,720, and inorganic hardening agents such as chrome alum, zirconium sulfate, and boric acid.

Among these hardening agents, preferable are 1,3,5-triacryloyl-hexahydro-s-triazine, 1,2-bisvinyl-sulfonylmethane, 1,3-bis(vinylsulfonylmethyl)propanol-2, bis(α-vinylsulfonylacetamide)ethane, sodium salt of 2,4-dichloro-6-hydroxy-s-triazine, 2,4,6-triethylenimino-s-triazine, boric acid, and the like.

The amount of the hardening agent to be added is preferably 0.5 to 5% by weight based on the binder contained in the layer to which the hardening agent is added.

The primer layer, intermediate layer, light-absorbing layer, protective layer, backcoat layer, and the like may be formed by using various surfactants for such purposes as coating aid, antistatic agent, improvement of sliding property, emulsification, and anti-blocking.

Examples of the surfactants include nonionic surfactants such as saponin, polyethylene oxide, polyethylene oxide derivatives such as alkyl ethers of polyethylene oxide; anionic surfactants such as alkylsulfonic esters, alkylbenzenesulfonic esters, alkylnaphthalenesulfonic esters, alkylsulfuric esters, N-acyl-N-alkyltaurines, sulfosuccinic esters, and sulfoalkylpolyoxyethylenealkyl phenyl ethers; amphoteric surfactants such as alkylbetaines and alkylsulfobetaines; cationic surfactants such as aliphatic or aromatic quaternary ammonium salts; and so on.

Further, the primer layer, intermediate layer, light-absorbing layer, protective layer, backcoat layer, and the like may further contain other additives, if necessary.

Examples of the other additives include dyes that prevent irradiation or halation, an ultraviolet light absorber, a plasticizer, a fluorescent brightener, a matting agent, a coating aid, a hardener, an antistatic agent, a sliding property improving agent, and so on. Typical examples of these additives are described in, for example, Research Disclosure, Vol. 176 (1978), December, Item 17643 and Vol. 187 (1979), November, Item 18716.

Besides the hardening agent described above, the protective layer may contain colloidal silica in order to reduce the adhesiveness of the protective layer.

Suitable examples of the colloidal silica include SNOWTEX 20, SNOWTEX 30, SNOWTEX C, SNOWTEX O, and SNOWTEX N, manufactured by Nissan Chemical Co., Ltd.

The amount of the colloidal silica to be added is preferably 5 to 80% by weight based on the binder contained in the protective layer.

It is preferable that the protective layer contains a matting agent. Examples of the matting agent include particles of inorganic compounds such as silica, magnesium oxide, barium sulfate, strontium sulfate, and silver halide; particles of polymers such as polymethyl methacrylate, polyacrylonitrile, and polystyrene; and particles of starches such as carboxy starch, corn starch, and carboxynitrophenyl starch. These particles may be used singly or in combinations of two or more kinds. Among these matting agents, polymethyl methacrylate particles and silica particles are particularly preferable.

Suitable examples of the silica particles include SYLOID AL-1, 65, 72, 74, 404, 620, 308, 978, 161, 244, 255, 266, and 150 manufactured by FUJI-DEVISON CHEMICAL LTD.

The average particle diameter of the matting agent is preferably 1 to 20 $\mu$m. The content of the matting agent in the protective layer is preferably 2 to 500 g/m$^2$, and more preferably 5 to 100 g/m$^3$.

In order to raise the whiteness level of the recording layer, the protective layer may contain a fluorescent brightener or a blue dye as a bluing agent.

The intermediate layer is a layer functioning as a barrier against the oxygen transmission. Normally, the layer contains a binder as a main component. If necessary, the intermediate layer may further contain an additive such as a hardening agent and a polymer latex. In the present invention, the intermediate layer may contain a light absorber such as an ultraviolet absorber that is described later so that the intermediate layer has a function as a light-absorbing layer, too.

The light-absorbing layer is a layer having a function of absorbing light such as ultraviolet. Normally, the layer contains a binder and a light absorber such as an ultraviolet absorber as main components. If necessary, the layer may further contain an additive such as a hardening agent and a polymer latex.

An ultraviolet absorber is commonly used as the light absorber. Conventionally known compounds, such as a benzotriazole-based compound, a cinnamic ester-based compound, an aminoallylidenemalonnitrile-based compound, and a benzophenone-based compound, can be used as the ultraviolet absorber.

The ultraviolet absorber can be added to the intermediate layer preferably by an oil-in-water dispersing method or by a latex dispersing method. Alternatively, the ultraviolet absorber can be added to a desired layer as an emulsion of the ultraviolet absorber.

According to the oil-in-water dispersing method, the ultraviolet absorber is dissolved in any one or a mixture of a high-boiling organic solvent having a boiling point of, for example, 175° C. or above and a so-called auxiliary solvent having a boiling point of, for example, 30 to 160° C., and the resulting solution is finely dispersed in an aqueous medium, such as water, an aqueous solution of gelatin, or an aqueous solution of polyvinyl alcohol, in the presence of a surfactant.

Specific examples of the high-boiling organic solvent are described in, for example, U.S. Pat. No. 2,322,027.

The same solvents as the solvents for the formation of microcapsules described previously can be preferably used as the above-mentioned high-boiling organic solvents and the auxiliary solvents.

The fine dispersing described above may be followed by a phase inversion. Further, if necessary, the auxiliary solvent may be removed or reduced by distillation, noodle-water washing, ultrafiltration, or the like, and thereafter the dispersion may be used for coating.

The details of the above-mentioned latex dispersing method and specific examples of the latex are described in, for example, U.S. Pat. Nos. 4,199,363, German Patent Application (OLS) Nos. 2,541,274 and 2-541,230, JP-A Nos. 49-74538, 51-59943, and 54-32552, and Research Disclosure, Vol. 148 (1976), August, Item 14850.

Suitable examples of the latex described above include latices produced by copolymerization between acrylates or methacrylates (e.g., ethyl acrylate, n-butyl acrylate, n-butyl methacrylate, and 2-acetoacetoxyethyl methacrylate) and acid monomers (e.g., acrylic acid and 2-acrylamide-methylpropanesulfonic acid).

In the present invention, particularly preferred examples of the ultraviolet absorber include an ultraviolet absorber having a structure difficultly diffusing into adjacent layers such as an ultraviolet absorber produced by copolymerization with a polymer or a latex.

As to such ultraviolet absorbers, reference can be made to the ultraviolet absorbers described in, for example, European Patent No. 127,819, JP-A Nos. 59-68731, 59-26733, and 59-23344, U.K. Patent No. 2,118,315, JP-A No. 58-111942, U.S. Pat. Nos. 4,307,184, 4,202,836, 4,202,834, 4,207,253, and 4,178,303, and JP-A No. 47-560.

Normally, these ultraviolet absorbers are added to the light-absorbing layer described above. If necessary, these ultraviolet absorbers are added to other layers such as the intermediate layer, protective layer, recording layer, and antihalation layer.

In the recording materials according to the first and second objects, as to the binders in the recording layer, primer layer, intermediate layer, light-absorbing layer, backcoat layer, protective layer, and the like, the following may be used as the binders besides the above-listed binders. That is, the water-soluble polymers that can be used for the emulsification of the photo-hardenable composition or the encapsulation of the electron-donating colorless dyes; and solvent-soluble polymers or polymer latices including acrylic resins such as polymethyl acrylate, polybutyl acrylate, polymethyl methacrylate, polybutyl methacrylate, and copolymers thereof, polystyrene, polyvinyl formal, polyvinyl butyral, phenol resins, styrene/butadiene resins, ethyl cellulose, epoxy resins, and urethane resins.

Among these substances, gelatin and vinyl alcohol are preferable.

These layers can be formed by preparing coating liquids for forming respective layers, applying the coating liquids onto the support (layer), and drying the coated layers. The coating method is the same as the coating method for the recording layer. Examples of the solvent for the coating liquid include alcohols such as methanol, ethanol, n-propanol, isopropanol, n-butanol, sec-butanol, methyl cellosolve, 1-methoxy-2-propanol; halogenated solvents such as methylene chloride and ethylene chloride; ketones such as acetone, cyclohexanone, and methyl ethyl ketone; esters such as methyl cellosolve acetate, ethyl acetate, and methyl acetate; toluene; xylene; and water. These solvents maybe used singly or in combination of two or more kinds.

Among these solvents, water is particularly preferred.

The suitable thickness of each layer formed on the support in the above-described way is 0.1 to 50 $\mu$m.

When the recording materials according to the first and second objects are used for full-color image formation, a laminate structure, comprising two or more recording layers each containing a color-forming component that develops a different color, is formed. It is preferable that each recording layer contains a color-forming component developing a different color and contains a photopolymerizable composition having a different sensitive wavelength region so that a polymerization reaction is initiated and a latent image is formed by light having a different wavelength. The sensitive wavelength region of the photopolymerizable composition can be adjusted by the combination of the organoboron compound and the organic dye contained.

When image recording is carried out by using the recording materials according to the first and second objects, various exposing methods such as exposure in contact with an original, enlarging exposure of a slide or liquid crystal image, and reflection exposure utilizing the reflective light of an original can be utilized.

When multicolor image recording is carried out by using the recording materials according to the first and second objects, single to multiple exposure is made by using light having different wavelengths. The light having different wavelengths can be obtained, for example, by change of the light sources or by change of the light filters.

Concurrently with the image-wise exposure or thereafter, the recording materials according to the first and second objects are subjected to heat development processing.

Conventionally known heating methods can be employed for the heat development processing. The heating temperature is normally 80 to 200° C. and preferably 100 to 160° C. The heating time is normally 1 second to 5 minutes and preferably 3 seconds to 1 minute.

It is preferable that the entire surface of the recording materials according to the first and second objects is exposed to light after the heat development processing so that the unhardened portions are also hardened by light.

The exposure of the entire surface to light inhibits the color-forming reaction in the background and inhibits the decolorization reaction in the colored portions. Therefore, the exposure of the entire surface to light is advantageous in enhancing the storability of images.

The recording materials according to the first and second objects can be suitably used to such applications as copier, fax, printer, label, colorproof, and second original.

EXAMPLES

The examples of the present invention will now be explained below. However, it should be noted that the present invention is not limited to these examples. In the following examples, "%" means "weight %" and "part" means "part by weight" unless otherwise specified.

Examples 1 to 23

Photopolymerizable compositions according to the following formulations were prepared by using exemplary compounds represented by any one of the general formulae (1) to (3) and the organoboron compounds listed in Table 1.

| [Photopolymerizable compositions] | |
|---|---|
| pentaerythritol tetraacrylate | 1.41 g |
| benzyl methacrylate/methacrylic acid copolymer (at a molar ratio of 73/27) | 1.29 g |
| methyl ethyl ketone | 12 g |
| propylene glycol monomethyl ether acetate | 8.62 g |
| exemplary compound (see Table 1) | 1 × 10$^{-4}$ mole |
| organoboron compound (see Table 1) | 6 × 10$^{-4}$ mole |
| methanol | 6 g |

Each of the photopolymerizable compositions thus prepared was applied at a thickness of 2 $\mu$m onto a polyethylene terephthalate film having a thickness of 100 $\mu$m and thereafter dried at 100° C. for 5 minutes. Further, the following coating liquid (1) for protective layer was applied at a thickness of 1 $\mu$m onto the layer described above and thereafter dried at 100° C. for 2 minutes. In this way, photosensitive recording materials of Examples 1 to 23 were prepared.

| [Coating liquid (1) for protective layer] | |
|---|---|
| water | 98 g |
| polyvinyl alcohol | 1.7 g |
| hydroxypropyolmethyl cellulose | 1.7 g |
| polyvinyl pyrrolidone | 8.7 g |

Comparative Examples 1 to 2

Photosensitive recording materials of Comparative Examples 1 to 2 were prepared by the same procedure as in Example 1, except that the organic dyes and the organoboron compounds of Example 1 were replaced, respectively, by the organic dyes and the organoboron compounds shown in Table 1. The structures of the organic dyes d-1 and d-2 listed in Table 1 are shown below.

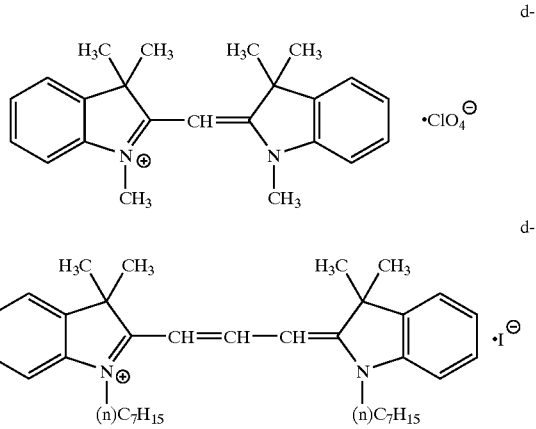

The photosensitive recording materials of Examples 1 to 23 and Comparative Examples 1 to 2 thus prepared were exposed to light by using a vacuum printing frame. The exposure was carried out by irradiating the photosensitive recording materials with light of a 500 W xenon lamp (manufactured by Ushio Co., Ltd.) for 10 seconds through a step wedge-(having a density difference in step of 0.15 and 1 to 15 density steps, "FUJI STEPGUIDE P" (manufactured by Fuji Photo film Co., Ltd.) and "SC 38 FILTER" (manufactured by Fuji Photo film Co., Ltd., a sharp cut filter eliminating light having wavelengths of 380 nm or less). After the exposure, photosensitive recording materials were subjected to development processing by using the developing solution having the following composition.

| [Developing solution] | |
|---|---|
| Anhydrous sodium carbonate | 10 g |
| Butyl cellosolve | 5 g |
| Water | 1 l |

Since the exposure amounts to the regions corresponding to higher step numbers of the step wedge were small, the photopolymerizable composition in these regions was dissolved in the developing solution in the development processing and the surface of the polyethylene terephthalate emerged. Of the photosensitive recording materials of the examples, the region where the photopolymerizable composition was completely dissolved was examined and the step number of the step wedge corresponding to the region of the largest exposure amount (i.e., clear step number) was sought. The higher the number, the higher the sensitivity of the photosensitive recording material is. The results are shown in Table 1.

In the case where the photopolymerizable composition was dissolved in the developing solution throughout the entire exposed region because of low sensitivity, the assessment result of the photopolymerizable composition was indicated as "flowed" in Table 1.

After the photosensitive recording materials of Examples 1 to 23 and Comparative Examples 1 to 2 thus prepared were exposed to the light of a fluorescent lamp (30000 lux) for 10 minutes, yellow, magenta, and cyan densities were measured using a transmission Macbeth densitometer. The better the decolorization by the exposure of the organic dye compounds contained, the fogging density of the background becomes lower. The results are shown in Table 1.

In Table 1, the figures in the column of exemplary compound No. correspond to the exemplary compound Nos. of the general formulae (1) to (3), and the symbols in the column of organoboron compounds correspond to the exemplary compound Nos. of the organoboron compounds. The same applies in Table 2.

TABLE 1

| | Exemplary compound No. | Organoboron compounds | Maximum absorption wavelength (nm) | Clear step number (step) | Fogging density after exposure | | |
|---|---|---|---|---|---|---|---|
| | | | | | Yellow | Magenta | Cyan |
| Example 1 | 1 | b-19 | 400 | 6 | 0.05 | 0.05 | 0.05 |
| Example 2 | 4 | b-19 | 460 | 6 | 0.06 | 0.05 | 0.05 |
| Example 3 | 6 | b-19 | 410 | 6 | 0.07 | 0.05 | 0.05 |
| Example 4 | 7 | b-19 | 420 | 7 | 0.05 | 0.05 | 0.05 |
| Example 5 | 9 | b-19 | 430 | 8 | 0.06 | 0.05 | 0.05 |
| Example 6 | 27 | b-19 | 410 | 8 | 0.05 | 0.05 | 0.05 |
| Example 7 | 30 | b-19 | 410 | 9 | 0.05 | 0.05 | 0.05 |
| Example 8 | 14 | b-19 | 470 | 9 | 0.05 | 0.05 | 0.05 |
| Example 9 | 17 | b-19 | 520 | 9 | 0.05 | 0.06 | 0.05 |
| Example 10 | 51 | b-19 | 500 | 7 | 0.05 | 0.07 | 0.05 |
| Example 11 | 32 | b-19 | 500 | 6 | 0.05 | 0.06 | 0.05 |
| Example 12 | 35 | b-19 | 510 | 9 | 0.05 | 0.05 | 0.05 |
| Example 13 | 20 | b-19 | 580 | 6 | 0.05 | 0.06 | 0.05 |
| Example 14 | 23 | b-19 | 610 | 5 | 0.05 | 0.05 | 0.06 |
| Example 15 | 26 | b-19 | 680 | 5 | 0.05 | 0.05 | 0.06 |
| Example 16 | 98 | b-19 | 560 | 6 | 0.05 | 0.05 | 0.07 |
| Example 17 | 111 | b-19 | 560 | 6 | 0.05 | 0.07 | 0.05 |
| Example 18 | 115 | b-19 | 620 | 5 | 0.05 | 0.05 | 0.07 |
| Example 19 | 30 | b-30 | 410 | 11 | 0.05 | 0.05 | 0.05 |
| Example 20 | 30 | b-31 | 410 | 10 | 0.05 | 0.05 | 0.05 |
| Example 21 | 62 | b-10 | 500 | 11 | 0.05 | 0.07 | 0.05 |
| Example 22 | 66 | b-10 | 400 | 7 | 0.05 | 0.05 | 0.05 |
| Example 23 | 68 | b-10 | 410 | 6 | 0.05 | 0.05 | 0.05 |
| Comparative example 1 | d-1 | b-19 | 440 | Flowed | 0.40 | 0.05 | 0.05 |
| Comparative example 2 | d-2 | b-19 | 560 | 4 | 0.05 | 0.25 | 0.05 |

Based on the results shown in Table 1, it was found that the photosensitive recording materials of Examples 1 to 23 had better sensitivity and exhibited better decolorization of organic dyes by exposure and lower fogging density in comparison with comparative Examples 1 to 2.

Example 24

1. Preparation of a Capsule Liquid of an Electron-donating, Colorless Dye 1-a Preparation of a Capsule Liquid of an Electron-donating, Colorless Dye (1)

8.9 g of the electron-donating, colorless dye (1) indicated below was dissolved in 16.9 g of ethyl acetate. To the solution were added 20 g of "TAKENATE D-110N"

(manufactured by Takeda Chemical Industries, Ltd.) and 2 g of "MILLIONATE MR 200" (manufactured by Nippon Polyurethane Industries, Ltd.) as encapsulants. The resulting solution was added to a mixture of 42 g of a 8% solution of phthalated gelatin and 1.4 g of a 10% solution of sodium dodecylbenzenesulfonate. The resulting mixture was emulsified at 20° C. and an emulsion was obtained. To the emulsion thus obtained were added 14 g of water and 72 g of a 2.9% aqueous solution of tetraethylene pentamine. After that, while being stirred, the mixture was heated to 60° C. and was kept at that temperature for 2 hours. In this way, a capsule liquid containing capsules, enclosing the electron-donating, colorless dye (1) as the core and having an average particle diameter of 0.5 μm, was obtained.

Electron-donating, Colorless Dye (1)

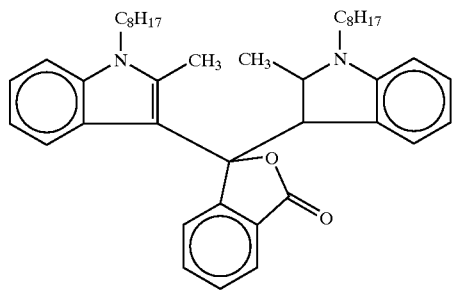

2. Preparation of an Emulsion of a Photopolymerizable Composition

2-a. Preparation of an Emulsion of a Photopolymerizable Composition 5.3 g of isopropyl acetate was added to 0.05 g of the organic dye shown in Table 2, 0.3 g of the organoboron compound shown in Table 2, 0.05 g of the following polymerization aid, and 4.2 g of the following polymerizable, electron-accepting compound (1), and the mixture was stirred to obtain a solution by dissolution.

Polymerization Aid (1)

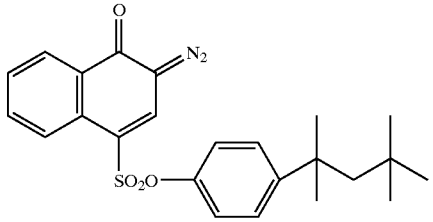

Polymerization, Electron-accepting Compound (1)

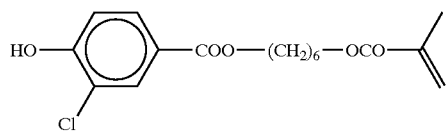

The solution was added to a mixture of 13 g of a 8% aqueous solution of gelatin, 0.8 g of a 2% aqueous solution of the surfactant (1), and 0.8 g of a 2% aqueous solution of the surfactant (2). The resulting mixture was emulsified at a revolution of 10000 rpm for 5 minutes by means of HOMOGENIZER (manufactured by NIPPON SEIKI Co., Ltd.), and an emulsion was obtained.

Surfactant (1)

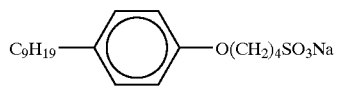

Surfactant (2)

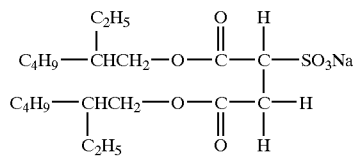

3. Preparation of a Coating Liquid for Recording Layer

3-a. Preparation of a Coating Liquid for Recording Layer (24)

A coating liquid for recording layer (24) was prepared by mixing 4 g of the capsule liquid of an electron-donating, colorless dye (1), 12 g of the emulsion of a photopolymerizable composition (24), and 12 g of a 15% aqueous solution of gelatin.

4. Preparation of a Coating Liquid (2) for Protective Layer

4-a. Preparation of a Coating Liquid (2) for Protective Layer

A coating liquid (2) for protective layer was prepared by mixing 4.5 g of a 10% aqueous solution of gelatin, 4.5 g of distilled water, 0.5 g of a 2% aqueous solution of the surfactant (3), and 0.3 g of a 2% aqueous solution of the surfactant (4), 0.5 g of a 2% aqueous solution of the hardening agent (1), "SYLOID 72" (manufactured by FUJI-DEVISON CHEMICAL LTD.) in an amount providing a coating amount of 50 mg/m², and 1 g of "SNOWTEX".

Surfactant (3)

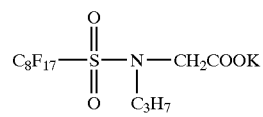

Surfactant (4)

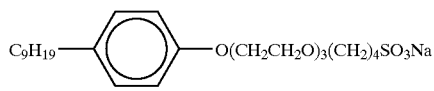

Hardening Agent (1)

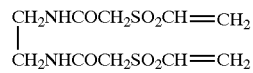

5. Support

A white polyester film filled with a white pigment and having a thickness of 100 μm ("LUMILAR-E68L" manufactured by Toray Industries, Inc.) was used as a support. By using a coating bar, the coating liquid for recording layer (24) was applied onto the support so that the dry weight of the coating layer became 6 g/m$^2$, and the layer was dried at 30° C. for 10 minutes. Onto the layer was applied, by using a coating bar, the coating liquid (2) for protective layer so that the dry weight of the coating layer became 2 g/m$^2$, and the layer was dried at 30° C. for 10 minutes. In this way, the photo- and heat-sensitive sheet of Example 24 was obtained.

Examples 25 to 35

Photo- and heat-sensitive sheets of Examples 25 to 35 were prepared by the same procedure as in Example 24, except that the organic dyes and the organoboron compounds of Example 24 were replaced, respectively, by the exemplary compounds represented by any one of the general formulae (1) to (3) and the organoboron compounds shown in Table 2.

Comparative Examples 3 to 4

Photo- and heat-sensitive sheets of Comparative Examples 3 to 4 were prepared by the same procedure as in Example 24, except that the organic dyes and the organoboron compounds of Example 24 were replaced, respectively, by the organic dyes and the organoboron compounds shown in Table 2.

The photo- and heat-sensitive sheets of Examples 24 to 35 and Comparative Examples 3 to 4 thus prepared were exposed to light using a vacuum printing frame by irradiating the photo- and heat-sensitive sheets with light of a 500 W xenon lamp for 30 seconds through a step wedge and SC 38 FILTER to thereby form respective latent images. After the exposure, each photo- and heat-sensitive sheet was heated for 15 seconds by means of a hot plate at 125° C. As a result, a magenta color, i.e., the color to be formed by the reaction between the electron-donating, colorless dye (1) and the polymerizable, electron-accepting compound (1), was formed in the unexposed portions, whereas the density of developed color was reduced or color formation did not occur in the exposed portions. The region where color formation did not occur was examined and the step number of the step wedge corresponding to the region of the smallest exposure amount (i.e., clear step number) was sought. The higher the number, the higher the sensitivity of the photo- and heat-sensitive sheet is. The results are shown in Table 2.

In the case where color formation occurred at all of the steps because of low sensitivity, the photopolymerizable composition rated as "all over" in Table 2.

Further, after the photo- and heat-sensitive sheets were expose to the light of a fluorescent lamp (30000 lux) for 10 minutes, yellow, magenta, and cyan densities of the background were measured using a transmission Macbeth densitometer. The better the decolorization by the exposure of the exemplary compounds, represented by any one of the general formulae (1) to (3), contained, the fogging density of the background becomes lower. The results are shown in Table 2.

TABLE 2

| | Exemplary compound No. | Organoboron compounds | Maximum absorption wavelength (nm) | Clear step number (step) | Fogging density after exposure | | |
|---|---|---|---|---|---|---|---|
| | | | | | Yellow | Magenta | Cyan |
| Example 24 | 1 | b-19 | 400 | 7 | 0.05 | 0.06 | 0.05 |
| Example 25 | 4 | b-19 | 460 | 7 | 0.06 | 0.08 | 0.05 |
| Example 26 | 30 | b-19 | 410 | 10 | 0.06 | 0.06 | 0.05 |
| Example 27 | 14 | b-19 | 470 | 10 | 0.06 | 0.06 | 0.06 |
| Example 28 | 51 | b-19 | 500 | 9 | 0.05 | 0.07 | 0.05 |
| Example 29 | 98 | b-19 | 560 | 10 | 0.05 | 0.07 | 0.05 |
| Example 30 | 111 | b-19 | 560 | 9 | 0.05 | 0.07 | 0.05 |
| Example 31 | 30 | b-30 | 410 | 12 | 0.06 | 0.06 | 0.05 |
| Example 32 | 30 | b-31 | 410 | 11 | 0.06 | 0.06 | 0.05 |
| Example 33 | 62 | b-10 | 500 | 12 | 0.05 | 0.07 | 0.05 |
| Example 34 | 66 | b-10 | 400 | 8 | 0.05 | 0.05 | 0.05 |
| Example 35 | 68 | b-10 | 410 | 7 | 0.05 | 0.05 | 0.05 |
| Comparative example 3 | d-1 | b-19 | 440 | All over | 0.42 | 0.06 | 0.05 |
| Comparative example 4 | d-2 | b-19 | 560 | 4 | 0.07 | 0.44 | 0.05 |

Based on the results shown in Table 2, it was found that the photo- and heat-sensitive recording materials of Examples 24 to 35 had better sensitivity and exhibited better decolorization of organic dyes by post-exposure and lower fogging density in comparison with Comparative Examples 3 to 4.

Effects of the Invention

According to the present invention, it is possible to provide a photopolymerizable composition which has a high sensitivity to not only ultraviolet light but also to visible to infrared light. It is also possible to provide a recording material which enables a perfectly dry image-recording system and can easily form black and white or colored images having excellent clarity and high contrast. In particular, it is possible to provide a recording material in which the fogging of the background is reduced.

What is claimed is:

1. A photopolymerizable composition comprising:

a polymerizable compound having an ethylenically unsaturated bond;

at least one of a compound represented by formula (8):

Formula (8)

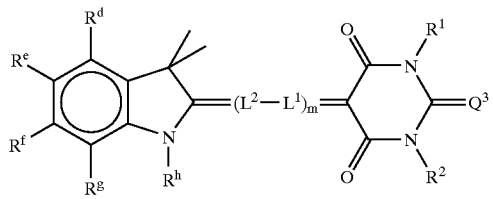

wherein $Q^3$ represents an oxygen atom or sulfur atom; $R^1$ and $R^2$ each independently represents a hydrogen atom, an aliphatic group, an aromatic group, or heterocyclic group; $L^1$ and $L^2$ each independently represents a methine group which may be substituted; m represents an integer of 1 to 3; $R^d$, $R^e$, $R^f$ and $R^g$ each independently represents a hydrogen atom or a monovalent substituent selected from the group consisting of hydrogen, halogen, alkyl, alkoxy, alkylsulfonyl, cyano, and nitro; $R^h$ represents a hydrogen atom, an alkyl group, an alkenyl group, an aryl group or a heterocyclic group;

and an organoboron compound represented by the following formula (A):

Formula (A)

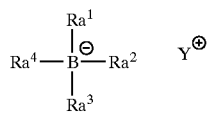

wherein $R_a^1$, $R_a^2$ and $R_a^3$ each independently represents an aliphatic group, an aromatic group, a heterocyclic group, or —$SiR_a^5R_a^6R^{a7}$ where $R_a^5$, $R_a^6$, and $R_a^7$ each independently represents an aliphatic group or an aromatic group; $R_a^4$ represents an aliphatic group; and $Y^+$ represents a group capable of forming a cation.

2. A recording material comprising a support having disposed thereon a recording layer containing at least microcapsules enclosing a color-forming component and the photopolymerizable composition described in claim 1, wherein the polymerizable compound having an ethylenically unsaturated bond is a compound having a site which reacts with the color-forming component and causes the color-forming component to develop a color.

3. A recording material according to claim 1 having a multilayer structure produced by laminating at least three recording layers to one another, each recording layer being sensitive to light of a different wave length, and each recording layer developing a different color when used for recording.

4. The composition of claim 1, wherein $Q^3$ of formula (8) represents a sulfur atom.

5. The composition of claim 4, wherein at least one of $R^d$, $R^e$, $R^f$ and $R^g$ is an electron-withdrawing group.

6. The composition of claim 5, wherein at least one of $R^d$, $R^e$, $R^f$ and $R^g$ is a sulfonyl group.

7. The composition of claim 6, wherein at least one of $R^d$, $R^e$, $R^f$ and $R^g$ is a sufonyl alkyl group.

* * * * *